(12) United States Patent
Nakajima et al.

(10) Patent No.: US 7,923,277 B1
(45) Date of Patent: Apr. 12, 2011

(54) PRODUCTION PROCESS FOR SURFACE-MOUNTING CERAMIC LED PACKAGE, SURFACE-MOUNTING CERAMIC LED PACKAGE PRODUCED BY SAID PRODUCTION PROCESS, AND MOLD FOR PRODUCING SAID PACKAGE

(75) Inventors: Naoto Nakajima, Utsunomiya Tochigi (JP); Shuichi Tsunoda, Shibukawa Gunma (JP); Akira Inaba, Kawasaki (JP)

(73) Assignee: E.I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 12/960,886

(22) Filed: Dec. 6, 2010

Related U.S. Application Data

(62) Division of application No. 12/244,799, filed on Oct. 3, 2008, now Pat. No. 7,871,842.

(51) Int. Cl.
 *H01L 21/00* (2006.01)
 *H01L 27/15* (2006.01)
 *H01L 29/26* (2006.01)
 *H01L 51/00* (2006.01)

(52) U.S. Cl. .......... 438/40; 438/25; 438/22; 438/24; 257/79; 257/81; 257/E51.019

(58) Field of Classification Search ............ 438/40, 438/25, 22, 24; 257/79, 81, E51.019
See application file for complete search history.

(56) References Cited

U.S. PATENT DOCUMENTS

| | | | | |
|---|---|---|---|---|
| 5,177,593 | A * | 1/1993 | Abe | ............ 257/98 |
| 5,861,670 | A | 1/1999 | Akasaki | |
| 6,300,576 | B1 | 10/2001 | Nakamura et al. | |
| 6,548,895 | B1 | 4/2003 | Benavides et al. | |
| 6,674,159 | B1 | 1/2004 | Peterson et al. | |
| 6,707,069 | B2 * | 3/2004 | Song et al. | ............ 257/79 |
| 7,279,724 | B2 | 10/2007 | Collins et al. | |
| 7,718,456 | B2 | 5/2010 | Maeda et al. | |
| 2008/0023713 | A1 | 1/2008 | Maeda et al. | |

FOREIGN PATENT DOCUMENTS

| | | |
|---|---|---|
| EP | 1873131 A | 1/2008 |
| JP | 2005-086051 A | 3/2005 |
| JP | 2006-100441 A | 4/2006 |
| JP | 2006-185986 A | 7/2006 |
| JP | 2006-261290 A | 9/2006 |
| JP | 2006-332381 A | 12/2006 |
| JP | 2007-095973 A | 4/2007 |
| WO | 0217401 A1 | 2/2002 |

OTHER PUBLICATIONS

International search Report for International Application No. PCT/US2009/059490 Dated Feb. 8, 2010.

* cited by examiner

*Primary Examiner* — Luan C Thai

(57) ABSTRACT

The present invention is related to a surface-mounting ceramic LED package and a method for its production comprising: layering a ceramic green sheet which has a hole and a second ceramic green sheet, inserting a mold with a groove to form a partition in the bottom of the ceramic green sheet substrate, and firing the ceramic green sheet substrate.

6 Claims, 20 Drawing Sheets

PRODUCTION PROCESS FOR SURFACE-MOUNTING CERAMIC LED PACKAGE, SURFACE-MOUNTING CERAMIC LED PACKAGE PRODUCED BY SAID PRODUCTION PROCESS, AND MOLD FOR PRODUCING SAID PACKAGE

CROSS-REFERENCE TO RELATED APPLICATIONS

This is a divisional application of application Ser. No. 12/244,799, filed on Oct. 3, 2008.

BACKGROUND OF THE INVENTION

1. Field of the Invention

The present invention relates to a production process for a surface-mounting ceramic light emitting diode (LED) package, a surface-mounting ceramic LED package produced by the production process, and a mold for producing the package.

2. Technical Background

LEDs are widely applied as backlighting for displays and light sources for general illumination and the like. LED packages can be broadly classified into dome packages and surface-mounting packages. In the case of the dome LED packages, an LED chip is mounted to a lead frame and the periphery thereof is molded into the shape of a dome with resin. The reason for molding the resin into the shape of a dome is to focus the light from the chip forward by refraction, thereby improving the amount of radiated light. In the case of the surface-mounting packages, an LED chip is placed in the bottom of a recess in a concave board and sealed with resin. Since surface-mounting types allow lower mounting height, smaller size and lighter weight, they have a wide range of applications and have a promising future. In the case of surface-mounting types, instead of refracting light with a molded resin in the manner of dome types, the walls of concave portions are facing upward (in the direction of the openings of the concave portions) and inclined so as to spread out, thereby serving to enhance the amount of radiated light.

Since LED chips are able to radiate light of a plurality of colors, LED devices can be obtained that radiate various colors of light by combining LED chips. However, when a plurality of LED chips is placed inside the same concave portion, there was the problem of light radiated from a certain LED chip being interfered with by the light from an adjacent LED chip. For example, in the case of obtaining white light, a method is employed that combines red (R), green (G) and blue (B) light. Ordinary LED chips are in the form of flat squares, and the light radiating therefrom lacks directivity and is emitted from nearly the entire surface thereof. Since light radiated from the sides of a chip opposes light radiated from an adjacent chip, radiated light of different wavelengths interfere causing the light to be mutually diminished. This results in problems of attenuation of the amount of radiated light and the occurrence of unevenness in the amount of light. In order to overcome this interference of light, a partition is provided in the bottom of the concave portions of surface-mounted LED devices in an attempt to reduce optical interference occurring between LED chips.

According to WO 2002/017401, the problem of a reduction in the amount of light radiated from the entire LED device is overcome by providing partitions between a plurality of LED chips in the bottom of concave portions of a plastic LED device to prevent light radiated from one LED chip from being interfered with by the light from another LED chip.

However, plastic is used for the package substrate in WO 2002/017401. Since plastic may be deteriorated by ultraviolet rays contained in light emitted from LED chips, it is not optimal for use in LED packages. In addition, although high-output LED chips emit radiated light of high brightness, the amount of heat dissipated also increases. Since plastic packages lack heat resistance, thermal deterioration is considerable thereby resulting in the problem of a short service life of the package itself.

On the other hand, although ceramic packages have superior heat resistance, they had the problem of being inferior to the moldability of plastic products with respect to fine structures such as inclined or curved radiated light reflecting surfaces or partitions between chips. For this reason, ceramic packages have difficulty in guiding light radiated from an LED chip in a desired direction, ultimately resulting in a loss in the amount of radiated light. Therefore, the shortcoming of ceramic packages having inferior moldability with respect to fine structures was overcome by effectively utilizing the properties of thermoplastic green sheets.

The present invention overcomes many of these problems by providing a production process for making a ceramic LED package, enabling partitions to be formed both easily and reliably, making a ceramic LED package having partitions, and making a mold for molding a ceramic LED package.

SUMMARY OF THE INVENTION

The production process for a surface-mounting ceramic LED package of the present invention comprises the steps of: (i) preparing a first ceramic green sheet and a second ceramic green sheet and forming through holes in the first ceramic green sheet; (ii) forming LED connection electrodes in the first and/or the second ceramic green sheet; (iii) layering the first ceramic green sheet and the second ceramic green sheet to form a ceramic green sheet substrate having a concave portion; (iv) inserting a mold, which comprises a base portion that presses portions other than the concave portion of the first ceramic green sheet of the ceramic green sheet substrate, and an insertion portion having a convex portion that protrudes from the base portion and presses the inside of the concave portion of the ceramic green sheet substrate, into the concave portion of the ceramic green sheet substrate so that the distal end surface of the convex portion contacts the bottom of the concave portion of the ceramic green sheet substrate, the distal end surface of the convex portion of the mold being provided with a groove for forming a partition in the bottom of the concave portion of the ceramic green sheet substrate; (v) crimping the ceramic green sheets by pressing the mold onto the ceramic green sheet substrate while at the same time press-forming into a shape in which a partition is formed in the bottom of the concave portion of the ceramic green sheet substrate and the lateral surface of the concave portion is inclined so as to spread toward the opening; and (vi) firing the crimped and press-formed ceramic green sheet substrate to form a ceramic substrate.

In another embodiment of the present invention, the step (ii) is a step (called ii' herein), in which via holes are provided in the second ceramic green sheet, an electrically conductive paste is filled into the via holes, and electrodes for achieving electrical continuity with the LED chip are formed in the surface of the second ceramic green sheet in contact with the first ceramic green sheet so as to cover the via holes; and the step (iii) is a step (iii'), in which the first ceramic green sheet is layered on the side of the second ceramic green sheet on which the electrodes have been formed to form a ceramic green sheet substrate having concave portions. Another embodiment of the present invention provides a production process of a ceramic LED package comprising the following steps of: (I) preparing a ceramic green sheet and forming LED connection electrodes in the ceramic green sheet using an electrically conductive paste; (II) contacting a mold with one side of the ceramic green sheet to form a concave portion by pressing, the mold comprising an insertion portion having a convex portion and a base portion having an insertion portion housing portion that houses the insertion portion, the insertion portion having a shape in which the apex of the convex portion is smaller than the bottom of the convex portion and the distal end surface of the convex portion has a groove therein, and the concave portion being formed so that a partition is formed in the bottom by the groove of the mold and so as to spread in a direction of the opening thereof; and (III) firing the ceramic green sheet in which the conductor layer has been formed.

Another embodiment provides a production process for making a ceramic LED package comprising the following steps of: (A) preparing a first ceramic green sheet and a second ceramic green sheet and forming through holes in the first ceramic green sheet; (B) forming LED connection electrodes in the first ceramic green sheet and/or the second ceramic green sheet; (C) inserting and pressing a first mold into the through holes of the first ceramic green sheet, the first mold comprising an insertion portion having a convex portion and a base portion having an insertion portion housing portion that houses the insertion portion, the insertion having a shape in which the apex of the convex portion is smaller than the bottom of the convex portion, the convex portion protruding from the base portion and being pressed so as to incline the walls of the through holes, and the base portion pressing portions other than the through holes; (D) pressing a second mold onto one side of the second ceramic green sheet, the second mold being provided with a groove for forming a partition in one side of the second ceramic green sheet, and a partition being provided in the surface of one side of the second ceramic green sheet by pressing with the mold; (E) layering the first ceramic green sheet and the second ceramic green sheet so that the partition of the second ceramic green sheet is surrounded by the inner walls of the through holes of the first ceramic green sheet; (F) thermal compression bonding the first and the second ceramic green sheets to form a ceramic green sheet substrate having a concave portion; and (G) firing the press-formed and thermal compression bonded ceramic green sheet substrate to form a ceramic substrate.

Another aspect of the present invention is a surface-mounting ceramic LED package. This package has a ceramic substrate having a concave portion, LED connection electrodes, and a partition provided in the bottom of the concave portion for separating the concave portion into two or more areas.

Another aspect of the present invention is a mold for producing a surface-mounting ceramic LED package. This mold comprises an insertion portion having a convex portion and a base portion having an insertion portion housing portion that houses the insertion portion. The mold has a shape in which the apex of the convex portion is smaller than the bottom of the convex portion, and the distal end surface of the convex portion has a groove.

Other characteristics of the inventions, as described above, will be clear from the detailed description of the present specification.

According to the present production process of a ceramic LED package of the present invention, a ceramic LED package, in which decreases in emission rate caused by optical interference can be avoided even in the case of having a plurality of LED chips, can be easily produced at good yield.

Figure 1A:
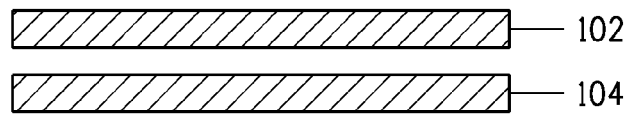
FIGS. 1A-1H describe, generally, the production process for surface mounting a ceramic LED package.

DETAILED DESCRIPTION OF THE INVENTION (I) Production Process of Surface-Mounting Ceramic LED Package First Embodiment A first aspect of the present invention is a production process of a surface-mounting ceramic LED package. A first embodiment of this production process comprises the following steps:

(i) preparing a first ceramic green sheet and a second ceramic green sheet, and forming through holes in the first ceramic green sheet, (ii) forming LED connection electrodes in the first and/or second ceramic green sheet, (iii) layering the first ceramic green sheet and the second ceramic green sheet to form a ceramic green sheet substrate having a convex portion, (iv) inserting a mold, which comprises a base portion that presses portions other than the concave portion of the first ceramic green sheet of the ceramic green sheet substrate, and an insertion portion having a convex portion that protrudes from the base portion and presses the inside of the concave portion of the ceramic green sheet substrate, into the concave portion of the ceramic green sheet substrate so that the distal end surface of the convex portion contacts the bottom of the concave portion of the ceramic green sheet substrate, the distal end surface of the convex portion of the mold being provided with a groove for forming a partition in the bottom of the concave portion of the ceramic green sheet substrate, (v) crimping the ceramic green sheets by pressing the mold onto the ceramic green sheet substrate while at the same time press-forming into a shape in which a partition is formed in the bottom of the concave portion of the ceramic green sheet substrate and the lateral surface of the concave portion is inclined so as to spread in a direction of the opening, and (vi) firing the crimped and press-formed ceramic green sheet substrate to form a ceramic substrate.

Although the following provides an explanation of each step of the first embodiment with reference to the drawings, the drawings are merely exemplary and the present invention is not limited thereto. Furthermore, when necessary, the same reference symbols are used to indicate the same constituent members in the drawings of the present application.

A first embodiment of the production process of a surface-mounting ceramic LED package of the present invention is explained with reference to FIG. 1. FIGS. 1A to 1H are drawings for explaining the above steps (i) to (vi) of the present invention.

Figure 1B:
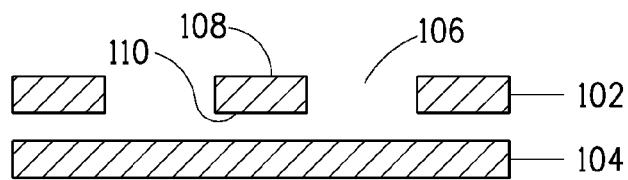

In step (i), as indicated in FIG. 1A, a first ceramic green sheet 102 and a second ceramic green sheet 104 are first prepared. Next, as shown in FIG. 1B, through holes 106 are formed in the first ceramic green sheet 102 with a punch and the like. The through holes 106 can have any shape corresponding to the application of the LED device. For example, in the case of viewing the through holes 106 from a first surface 108 of the first green sheet 102, the shape of the opening may be circular, oval or rectangular and the like, and in the case of forming the through holes 106 with a punch and the like, the lateral surface 108 of the through holes 106 becomes a vertical lateral surface facing in the direction of radiation of light of the LED, namely toward the first surface 108 from a second surface 110 of the first green sheet 102.

The size of the through holes 106 is required to be adjusted according to the size of an LED chip mounted on the LED package or according to the number of LED chips mounted. It is necessary that the size of the through holes 106 be suitably adjusted according to the size of an LED chip mounted on the LED package or according to the number of LED chips mounted and the value of current that flows thereto. For example, in the case of mounting four 0.3 W LED chips, the diameter of the through holes has a size of 3 to 5 mm. A green sheet for low temperature co-fired ceramics (LTCC) or a green sheet for high temperature co-fired ceramics (HTCC) can be used as materials of the first ceramic green sheet and second ceramic green sheet able to be used in the present invention. LTCC are composed by, for example, mixing and coating a ceramic raw material powder composed of a mixture of powdered borosilicate glass and alumina powder, a binder composed of a thermoplastic acrylic resin and the like, an organic solvent and water followed by molding. An HTCC green sheet has for a main component thereof alumina, aluminum nitride, mullite, cordierite, zirconia, magnesia or SiC fired at 1000° C. or higher followed by the addition of an organic binder and plasticizer. A commercially available LTCC or HTCC green sheet may be used in the present invention. The thickness of the first ceramic green sheet is preferably 0.5 to 1.0 mm and more preferably 0.6 mm, and can be obtained by, for example, layering two 0.3 mm green sheets. The second ceramic green sheet can be made to be of a similar thickness.

Next, in step (ii), electrodes 111 for achieving electrical continuity with the LED chip are formed in advance on the first ceramic green sheet and/or the second ceramic green sheet.

Figure 1C:
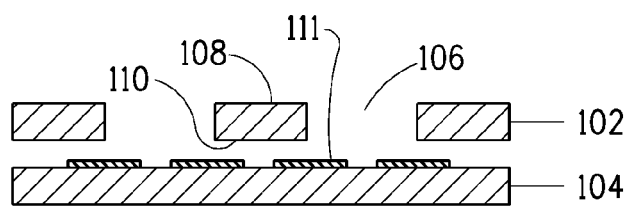

FIG. 1C shows the case of having formed both poles of the electrodes on the second ceramic green sheet. In addition, in the example of FIG. 1C, an electrode is formed for each region where an LED chip is mounted. The formation of each electrode may be carried out by, for example, printing an electrically conductive paste using a conventional method such as screen printing.

For example, a wiring pattern can be printed by placing a screen mask, in which a printing pattern is formed for printing a wiring pattern from a location where an LED is mounted to a connection terminal leading to the outside, on a green sheet, supplying an electrically conductive paste to the screen mask, and sliding a squeegee over the upper surface of the screen mask (not shown).

There are no particular limitations on the electrically conductive paste provided it is used for connecting an LED, and is composed of an electrically conductive metal powder, resin and solvent. The resin used in the electrically conductive paste is a cellulose-based resin or acrylic resin. The content of the resin and solvent is 5 to 25% by weight. The solvent is added to adjust the viscosity of the resin used. For example, a higher alcohol such as terpineol or ester thereof is added. Examples of the electrically conductive metal powder include gold, platinum, silver, palladium, copper, nickel, rhodium, aluminum and alloys thereof. Since the firing temperature varies according to the type of ceramic (LTCC or HTCC), it is necessary to select the type of electrically conductive metal powder accordingly. In the present invention, a commercially available electrically conductive paste containing silver (LT133, Dupont) for use with LTCC, tungsten or molybdenum for use with HTCC, or paste containing a mixture of both types of metal powders mixed with a cellulose-based resin and a solvent, for example, can be used for the electrically conductive paste used. In addition, in the case of forming both electrodes on the second green sheet, electrodes are arranged at the junctions between the first ceramic green sheet 102 and the second ceramic green sheet 104 to as to provide a connection with the outside.

In addition, in another embodiment, as will be subsequently explained in detail in the section on a surface-mounting ceramic LED package as a second aspect of the present invention, one of the electrodes (such as the cathode) can be formed on the first green sheet, while the other electrode (such as the anode) can be formed on the second green sheet. In this case, one of the electrodes (such as the cathode) can be formed on the side of the first surface 108 of the first ceramic green sheet, and electrical continuity with an LED chip can be achieved with a wire connection. In addition, in the present invention, electrodes may be provided on both the first ceramic green sheet and the second ceramic green sheet.

Figure 1D:
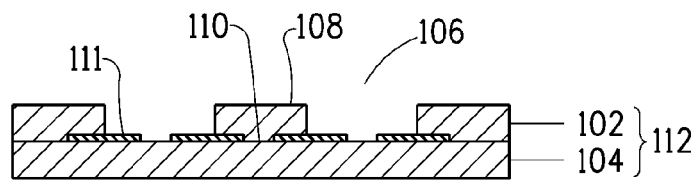

Next, in step (iii), as shown in FIG. 1D, the first ceramic green sheet 102 in which the through holes 106 are formed and the second ceramic green sheet 104 are layered to form a ceramic green sheet substrate 112 having a concave portion.

In the case of having printed one of the electrodes on the first ceramic green sheet 102 in step (ii), the first and second ceramic green sheets are joined so that this electrode is on the side of the first surface 108 of the first ceramic green sheet. In addition, in the case of having arranged both electrodes on the second ceramic green sheet, the first and second ceramic green sheets are joined so that both electrodes are on the side where the first ceramic green sheet and the second ceramic green sheet are joined.

It is necessary to adjust the thickness of the ceramic green sheet substrate 112 according to desired strength and heat dissipation characteristics. If the substrate is too thin, the strength of the ceramic substrate after firing decreases, while if too thick, the problem results of difficulty in dissipating heat generated from the LED chip. The thickness of the ceramic green sheet substrate can be adjusted by combining the thicknesses and number of the first and second ceramic green sheets. The thickness of the ceramic green sheet substrate 112 is suitably adjusted according to the power (output) of the LED chip. In the case of chips that generate heat, a thin substrate is preferable from the viewpoint of dissipating heat. For example, in the case of mounting four 0.3 W LED chips in through holes having a size of 3 to 5 mm, the thickness of the ceramic green sheet substrate 112 is preferably 1.0 to 2.0 mm.

Figure 1E:
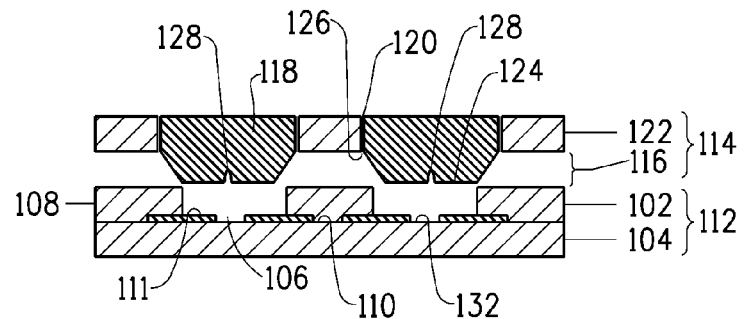

Next, as shown in FIG. 1E, step (iv) is a step in which a mold 114 is inserted into the through holes 106 of the ceramic green sheet substrate 112. As will be subsequently explained in the section on a third aspect of the present invention, this mold 114 comprises an insertion portion 118 having a convex portion 116, and a base portion 122 having an insertion portion housing portion 120 that houses the insertion portion 118, has a tapered shape in which the apex (distal end surface) 124 of the convex portion 116 is smaller than the bottom 126 of the convex portion, and a groove 128 is formed in the distal end surface of the convex portion. Gaps are provided in the mold between the base portion 122 and the insertion portion 118, enabling the insertion portion 118 to slide in the perpendicular direction with respect to the base portion 122. In addition, surface irregularities may be formed in the lateral surface of the mold and/or the inner peripheral surface of the groove, and surface irregularities in the lateral surface of the concave portion and/or a partition may be formed during the press forming of step (v) described below. A metal material, wood, heat-resistant resin or the like that does not become deformed during press forming can be used for the material of the mold.

This type of mold 114 is layered so that the convex portion 116 of the mold is inserted into the concave portion 106 of the ceramic green sheet substrate.

Figure 1F:
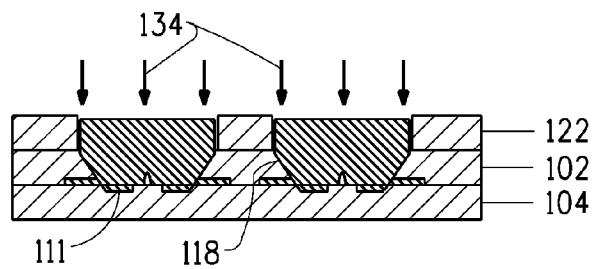
Figure 1G:
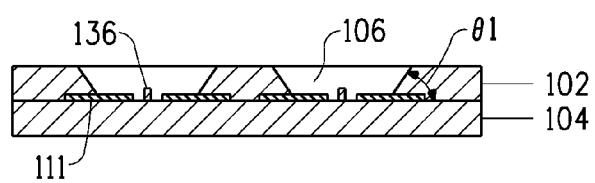
Figure 1H:
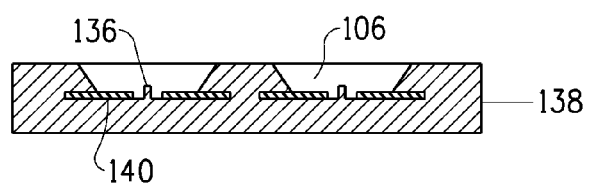

Next, in step (v), as shown in FIG. 1F, the ceramic green sheet substrate and the mold described above are pressed. As a result of this pressing, the plurality of layered ceramic green sheets are mutually crimped thereby integrating the plurality of ceramic green sheets into a single unit (FIG. 1G).

Although the conditions for pressing are adjusted according to the number of ceramic green sheets, the temperature range during pressing is preferably 50 to 110° C., and the pressure 134 is preferably set to 5 to 50 MPa.

In the present invention, the lateral surface of the convex portion 116 of the mold insertion portion 118 has an inclined shape (tapered shape), and since the ceramic green sheets have a certain degree of plasticity, by pressing the convex portion 116 of the mold into the through holes 106 possessed by the first ceramic green sheet, the inner peripheral surfaces of the through holes 106 remember the shape of the inclined (tapered) lateral surface of the convex portion possessed by the mold. In this manner, in the ceramic green sheet substrate obtained through step (iv), although the inner peripheral surface (wall) 130 of the concave portion is perpendicular to the first surface 108 of the first ceramic green sheet in the case of having formed through holes with a punch, for example, after being pressed with the mold, the inner peripheral surface 130 of the concave portion has an incline in which it spreads from the bottom 132 of the concave portion to the side of the first surface of the through holes of the first ceramic green sheet (also referred to as the opening side or opening direction in the present specification). In this manner, the inner peripheral surfaces of the through holes of the ceramic green sheet are molded to a shape that corresponds to the shape of the convex portion of the mold to be described later. The angle of inclination θ1 of concave portion lateral surface 130 (see FIG. 1G) is preferably 10 to 89 degrees. Since the ceramic sheets have thermoplasticity, they soften and match the shape of the mold when heated during pressing. The rigidity of the ceramic sheets returns when they are allowed to cool to the vicinity of room temperature following pressing, thereby enabling them to maintain their formed shape. Furthermore, although the above explanation is of the case of the lateral surface of the convex portion 116 of the mold being inclined, the present invention is not limited thereto, but rather the lateral surface of the convex portion may also not be inclined. In addition, the inclined portion of the mold may have a linear or curved direction of inclination. Radiation status can be controlled by adjusting the reflection angle of the light emitted from the LED.

In the present invention, a groove 128 can be provided in the distal end surface 124 of the convex portion of the insertion portion 118 of the mold 114. When provided with the groove 128 in this manner, a partition 136 of a shape corresponding to the shape of the groove is formed in the bottom of the concave portion during press forming (FIG. 1G). The shape and so forth of the partition is subsequently described in detail in the section on a ceramic LED package (second aspect of the present invention).

In the past, when a conventional integrated convex portion type of mold having a plurality of convex portions is used when pressing a ceramic green sheet, there was the problem of the bottom of each of a plurality of convex portions formed in a single ceramic green sheet substrate not being pressed with equal pressure due to the presence of protrusions in the surface of the ceramic green sheets. In other words, although the bottoms of certain concave portions are adequately pressed to obtain a flat surface, in the bottoms of other concave portions, the distal end surfaces of the convex portions of the mold are not pressed adequately, thereby resulting in the possibility of protrusions remaining in the surface of ceramic green sheets. If the bottom of a concave portion is not flat, the LED chip ends up inclining resulting in a decrease in the amount of radiated light and reducing yield during production of LED packages. In the invention of the present application, as a result of using the mold to be described later, the insertion portion 118 is able to move independently of the base portion 122, thereby enabling the bottoms of a plurality of concave portions to be pressed evenly and allowing the obtaining of flat bottoms.

A hydrostatic press or hydraulic press is preferably used in the present step. A hydrostatic press or hydraulic press refers to that which applies pressure using a fluid to a pressurized article in a fluid such as water or oil, and allows pressure to be applied uniformly throughout the entire pressurized article. At this time, although the ceramic green sheet substrate and mold are placed in a water-impermeable bag, it is necessary to draw a vacuum within the bag to prevent the entry of air bubbles into the bag.

Furthermore, when using a hydrostatic or hydraulic press, it is preferable to house a base plate in the bag for supporting the ceramic green sheet substrate, mold and green sheet substrate. When the ceramic green sheet substrate, mold and base plate in the bag are placed in a hydrostatic press and the ceramic green sheet substrate is clamped between the mold and the base plate, uniform pressure can be applied from the back of the ceramic green sheet substrate enabling the back to have a smoother finish.

Since the base plate is required to have adequate strength to withstand high pressure, it is preferably a metal plate made of iron, stainless steel or copper, or made of wood or heat-resistant resin and the like that does not significantly deform during pressing when high pressure is applied. Furthermore, the application of a small amount of a release agent such as silicone oil to the surfaces of the mold and base plate prior to pressing facilitates separation from the green sheet after pressing.

In the production process of the present invention, in the case an electrically conductive paste is printed for the electrodes 111 of the second green sheet, press forming is carried out after allowing the electrically conductive paste to dry. Since the electrically conductive paste is a mixture of electrically conductive metal powder and contains a resin and solvent, it has a certain degree of flexibility and plasticity even after drying. Thus, even if the mold is pressed onto the printed electrically conductive paste from above, there is no breakage of the electrically conductive paste. For example, even in the case of pressing a ceramic green sheet substrate having a thickness of 1.2 mm, on which is printed an electrically conductive paste at a thickness of 10 to 15 μm, with the mold so that the apex of the convex portion of the insertion portion is pressed to a depth of 50 μm from the surface of the second ceramic green sheet, there is no breakage of the electrically conductive paste layer. In addition, the electrically conductive paste may also be printed at a location where the partition 136 is formed. In such a case as well, there is no breakage of the electrodes due to pressing for the same reasons as described above.

Next, in step (vi), the press-formed ceramic green sheet substrate is fired. The ceramic green sheet substrate is fired to obtain a ceramic LED package (see FIG. 1H). It is necessary to adjust the firing conditions in consideration of the type of green sheet and the temperature and time at which the ceramic green sheet and the metal powder in the electrically conductive paste printed on the green sheet are sintered. In the case silver powder is used in the electrically conductive paste, firing conditions consist of a temperature of preferably 600 to 920° C. and more preferably 800 to 900° C. for 30 minutes to 1.5 hours and a total time of 4 to 16 hours in the case of LTCC green sheets, while firing conditions consist of a temperature of preferably 1200 to 1600° C. and more preferably 1300 to 1500° C. for 50 minutes to 1 hour in the case of HTCC green sheets. Firing is carried out with an ordinary belt oven or box oven and the like used for LED packages.

Second Embodiment

A second embodiment of the production process of the present invention is the above-mentioned first embodiment, wherein the step (ii) is a step (ii'), in which via holes are provided in the second ceramic green sheet, an electrically conductive paste is filled into the via holes, and electrodes for achieving electrical continuity with the LED chip are formed in the surface of the second ceramic green sheet in contact with the first ceramic green sheet so as to cover the via holes; and the step (iii) is a step (iii'), in which the first ceramic green sheet is layered on the side of the second ceramic green sheet on which the electrodes have been formed to form a ceramic green sheet substrate having concave portions.

Although the following provides an explanation of the second embodiment with reference to the drawings, the drawings are merely exemplary and the present invention is not limited thereto. FIG. 2 is a drawing for explaining a production process of a ceramic LED package of the second embodiment. Those steps other than step (ii') and step (iii') either use means similar to the previously described first embodiment, or can be carried out by a person with ordinary skill in the art by making known changes with respect to, for example, the pressure used during pressing or the firing conditions in the firing step.

Figure 2A:
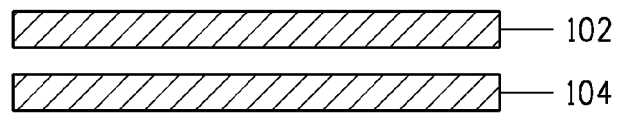
FIGS. 2(a) and 2(b) show a second embodiment where a first ceramic green sheet and second ceramic green sheet are prepared and through holes are formed in the first ceramic green sheet.
Figure 2B:
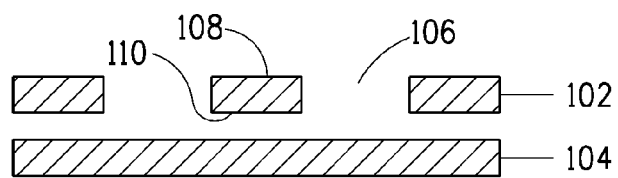

In the second embodiment, a first ceramic green sheet and a second ceramic green sheet are prepared, and through holes 106 are formed in the first ceramic green sheet in the same manner as the above-mentioned step (i) (see FIGS. 2A and 2B).

Figure 2C:
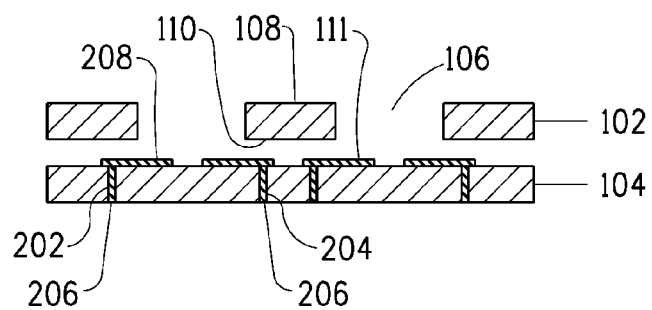
FIG. 2C shows via holes 202 and 204 formed in the second ceramic green sheet 104.

In step (ii'), via holes 202 and 204 are formed in the second ceramic green sheet, an electrically conductive paste 206 is filled therein, and electrodes 208 for achieving electrical continuity with an LED chip are formed in the second ceramic green sheet (see FIG. 2C).

The via holes 202 and 204 may be formed by a method such as punching at predetermined locations of the second ceramic green sheet 104.

Although there are no particular limitations on the size of the via holes, the cross-sectional area thereof is preferably large enough for enhancing heat dissipation efficiency within a range that maintains cavity strength. More specifically, in the case of the surface area of the bottom of the cavity being 7.0 mm$^2$, for example, the second ceramic green sheet preferably has 8 to 11 via holes having a diameter of 200 to 400 μm.

Next, an electrically conductive paste is filled into the formed via holes 202 and 204 to form electrodes 208 for achieving electrical continuity with an LED. Filling of the electrically conductive paste and formation of the electrodes are typically carried out by printing such as screen printing. Further, wiring may also be carried out for acquiring electrical continuity with the outside. Filling of the via holes 202 and 204 of the second ceramic green sheet 104 and formation of the electrodes 208 may be carried out simultaneously from the viewpoint of reducing production cost.

Figure 2D:
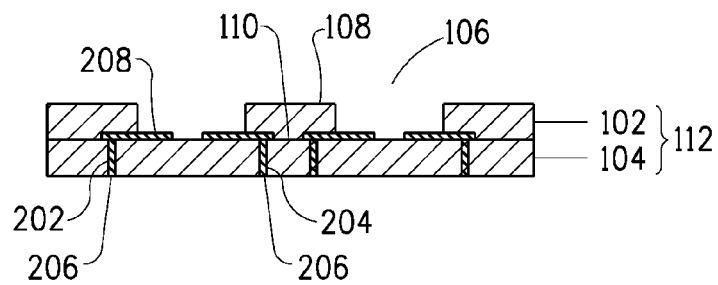
FIG. 2D shows the layering of the first ceramic green sheet over a second ceramic green sheet on which the electrodes are formed followed by FIGS. 2E-H shows the further steps, as in steps 1A-AH, of carrying out the production process for surface mounting a ceramic LED package.
Figure 2E:
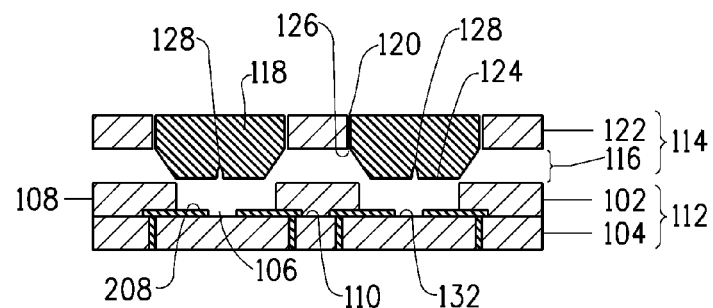
Figure 2F:
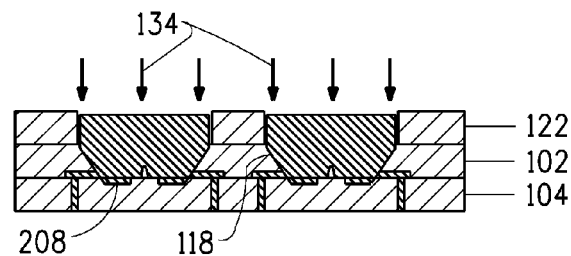
Figure 2G:
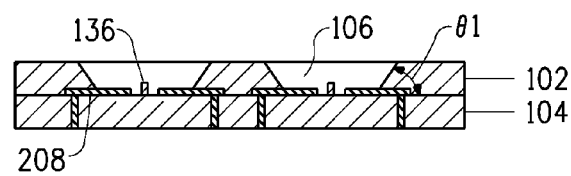
Figure 2H:
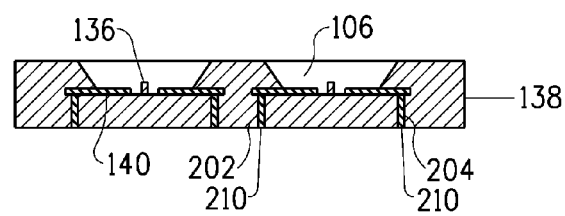

Next, in step (iii'), the first ceramic green sheet 102 is layered over the side of the second ceramic green sheet 104 on which the electrodes 208 are formed to form a ceramic green sheet substrate 112 having concave portions (see FIG. 2D).

The various conditions for the first ceramic green sheet, the second ceramic green sheet, the electrically conductive paste and the like in the steps (ii') and (iii') described above are as explained for the first embodiment.

The steps (iv) to (vi) explained in the first embodiment are then carried out following the above steps (see FIGS. 2E to 2H).

According to the production process of the present invention as described above, a surface-mounting ceramic LED package can be produced having electrodes, a partition, a concave portion (having a predetermined angle of the lateral surface thereof (θ1=10 to 89 degrees)) and the like.

Third Embodiment

A third embodiment of the production process of the present invention is a process in which a concave portion having a partition is formed directly in a ceramic green sheet. More specifically, this process comprises the steps of:
(I) preparing a ceramic green sheet and forming LED connection electrodes in the ceramic green sheet using an electrically conductive paste;
(II) contacting a mold with one side of the ceramic green sheet to form a concave portion by pressing, the mold comprising an insertion portion having a convex portion and a base portion having an insertion portion housing portion that houses the insertion portion, the insertion portion having shape in which the apex of the convex portion is smaller than the bottom of the convex portion and the distal end surface of the convex portion having a groove therein, and the concave portion being formed so that a partition is formed in the bottom by the groove of the mold and so as to spread in a direction of the opening thereof; and (III) firing the ceramic green sheet in which the conductor layer has been formed.

Although the following provides an explanation of each step of the third embodiment with reference to the drawings, the drawings are merely exemplary and the present invention is not limited thereto.

The third embodiment of a production process of a surface-mounting ceramic LED package of the present invention is explained with reference to FIG. 3. FIGS. 3A to 3F are drawings for explaining the above-mentioned steps (I) to (III) of the present invention.

Figure 3A:
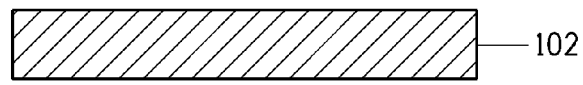
FIGS. 3(a)-3(f) shows the preparation of a ceramic green sheet, formation of electrodes, and firing process for obtaining a ceramic LED package.

First, in step (I), as shown in FIG. 3A, a ceramic green sheet 102 is prepared. The ceramic green sheet may consist of a plurality of ceramic green sheets layered and pressed together in order to ensure the required film thickness.

Figure 3B:
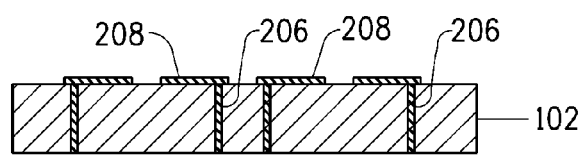

Next, electrodes for achieving electrical continuity with an LED chip in advance are formed in the prepared ceramic green sheet. As shown in FIG. 3B, formation of the electrodes can be carried out by forming electrodes 208 using an electrically conductive paste followed by achieving electrical continuity through via holes 206. Electrically conductive paste is also filled into the via holes 206. Although the example of FIG. 3B shows the formation of electrodes 208 and via holes 206, only electrodes may be formed as in the previously described first embodiment.

In the production process of the present invention, the electrically conductive paste can be formed by printing. The electrically conductive paste is as explained in the first embodiment. A method known in the prior art such as screen printing can be applied for the screening method. The conditions for forming the electrodes and via holes are as explained in the previously described first and second embodiments.

Figure 3C:
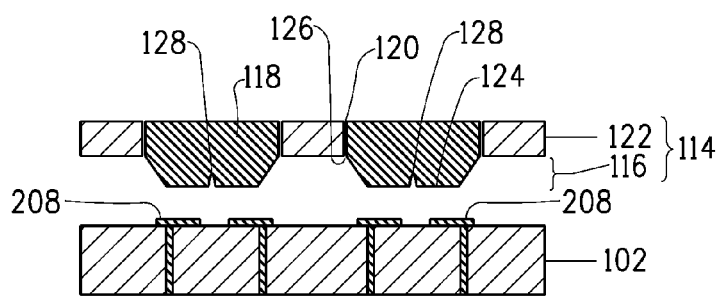

Next, as shown in FIG. 3C, a mold 114 is contacted with the ceramic green sheet 102. This mold is the same as that explained in the production process of the first embodiment. This mold 114 is layered over the ceramic green sheet 102 so that a convex portion 116 of the mold contacts one side of the ceramic green sheet 102.

Figure 3D:
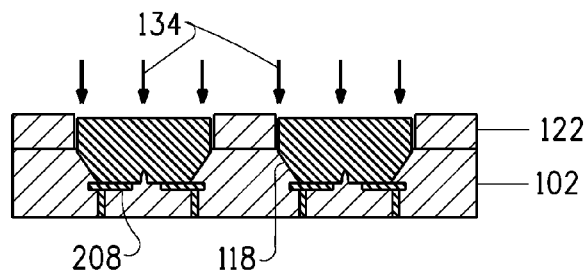
Figure 3E:
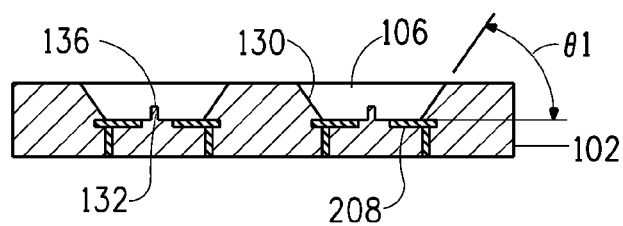
Figure 3F:
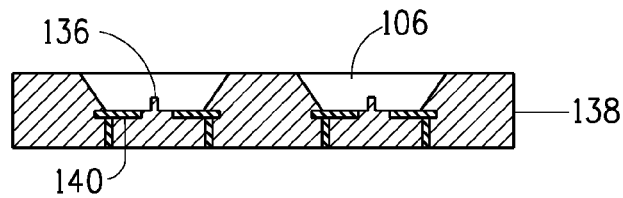

Next, as shown in FIG. 3D, the mold is pressed onto the ceramic green sheet in the state described above. As a result of this pressing, the concave portion 106 having a partition 136 in the bottom thereof is formed in the ceramic green sheet (FIG. 3E).

Although pressing conditions are adjusted according to the number of ceramic green sheet substrates, the temperature range thereof is preferably 50 to 110° C. and the setting for pressure 134 is preferably 5 to 50 MPa.

In the present invention, as was previously described, the lateral surface of the convex portion 116 of the insertion portion 118 of the mold has an inclined (tapered) shape, and since the ceramic green sheet is provided with a certain degree of plasticity, a concave portion is formed in the ceramic green sheet having a wall that coincides with the shape of the inclined (tapered) lateral surface of the convex portion of the mold. In this manner, in the ceramic green sheet substrate obtained in this step, the inner peripheral surface (wall) 130 of the concave portion is of a shape having an incline that spreads toward the opening of the ceramic green sheet from the bottom 132 of the concave portion after being pressed with the mold. In this manner, the inner peripheral surface of the wall of the ceramic green sheet is molded to a shape corresponding to the shape of the convex portion of the mold to be described later. The angle of inclination θ1 of concave portion lateral surface 130 (see FIG. 3E) is preferably 10 to 89 degrees. Since the ceramic green sheet has thermoplasticity, it softens and matches the shape of the mold when heated during pressing. The rigidity of the ceramic green sheet returns when it is allowed to cool to the vicinity of room temperature following pressing, thereby enabling it to maintain its formed shape. Furthermore, although the above explanation is of the case of the lateral surface of the convex portion 116 of the mold being inclined, the present invention is not limited thereto, but rather the lateral surface of the convex portion may also not be inclined. In addition, the inclined portion of the mold may have a linear or curved direction of inclination. Radiation status can be controlled by adjusting the reflection angle of the light emitted from the LED.

In the present invention, a groove 128 can be provided in the distal end surface 124 of the convex portion of the insertion portion 118 of the mold 114. When provided with the groove 128 in this manner, a partition 136 of a shape corresponding to the shape of the groove is formed in the bottom of the concave portion during press forming (FIG. 3E). The shape and so forth of the partition is subsequently described in detail in the section on a ceramic LED package (second aspect of the present invention).

In this third embodiment, as well, a hydrostatic press or hydraulic press is preferably used when pressing the ceramic green sheet.

Furthermore, when using a hydrostatic or hydraulic press, it is preferable to house a base plate in a bag for supporting the ceramic green sheet substrate, mold and green sheet substrate. When the ceramic green sheet substrate, mold and base plate in the bag are placed in a hydrostatic press and the ceramic green sheet substrate is clamped between the mold and the base plate, uniform pressure can be applied from the back of the ceramic green sheet substrate enabling the back to have a smoother finish.

The base plate is as explained in the description of the first embodiment.

Next, in step (III), the ceramic green sheet on which a conductor layer has been formed is fired. In this step, the ceramic green sheet is fired to obtain a ceramic LED package (see FIG. 3F). It is necessary to adjust the firing conditions by taking into consideration the temperature and time at which the ceramic green sheet is fired according to the type of green sheet, metal powder contained in the electrically conductive paste printed on the green sheet and so forth. In the case where silver powder is used in the electrically conductive paste, firing conditions consist of a temperature of preferably 600 to 920° C. and more preferably 800 to 900° C. for 30 minutes to 1.5 hours and a total time of 4 to 16 hours in the case of LTCC green sheets, while firing conditions consist of a temperature of preferably 1200 to 1600° C. and more preferably 1300 to 1500° C. for 50 minutes to 1 hour in the case of HTCC green sheets. Firing is carried out with an ordinary belt oven or box oven and the like used for LED packages.

A fourth embodiment of the production process of the present invention is a process for producing a surface-mounting ceramic LED package of the first embodiment, wherein a first ceramic green sheet and a second ceramic green sheet are processed separately, and the resulting processed products are crimped to obtain a ceramic green sheet substrate followed by firing the resulting ceramic green sheet substrate. More specifically, this process comprises the steps of:

(A) preparing a first ceramic green sheet and a second ceramic green sheet and forming through holes in the first ceramic green sheet;

(B) forming LED connection electrodes in the first ceramic green sheet and/or the second ceramic green sheet;

(C) inserting and pressing a first mold into the through holes of the first ceramic green sheet, the first mold comprising an insertion portion having a convex portion and a base portion having an insertion portion housing portion that houses the insertion portion, the insertion portion having a shape in which the apex of the convex portion is smaller than the bottom of the convex portion, the convex portion protruding from the base portion and being pressed so as to incline the walls of the through holes, and the base portion pressing portions other than the through holes;

(D) pressing a second mold onto one side of the second ceramic green sheet, the second mold having a convex portion and being provided with a groove on the distal end surface of the convex portion for forming a partition in one side of the second ceramic green sheet, and a partition being provided in the surface of one side of the second ceramic green sheet by pressing with the mold;

(E) layering the first ceramic green sheet and the second ceramic green sheet so that the partition of the second ceramic green sheet is surrounded by the inner walls of the through holes of the first ceramic green sheet;

(F) thermal compression bonding the first and the second ceramic green sheets to form a ceramic green sheet substrate having a concave portion; and (G) firing the press-formed and thermal compression bonded ceramic green sheet substrate to form a ceramic substrate.

Figure 4A:
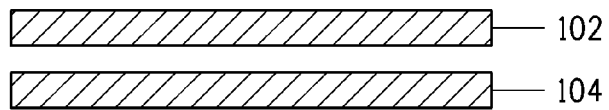
FIGS. 4(a)-(k) describe a production process for surface mounting a ceramic LED package wherein a first ceramic green sheet and second ceramic green sheet are produced separately and the resulting products are crimped to obtain a substrate then fired.
Figure 4B:
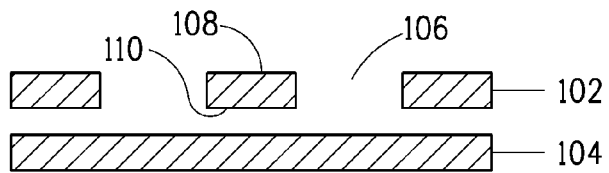

In step (A), as shown in FIG. 4A, a first ceramic green sheet 102 and a second ceramic green sheet 104 are first prepared. The materials and other conditions of the first and second ceramic green sheets are as previously explained in the first embodiment. Next, as shown in FIG. 4B, through holes 106 are formed with a punch and the like in the first ceramic green sheet 102. The shape, dimensions and other conditions of the through holes 106 are the same as in the first embodiment.

Figure 4C:
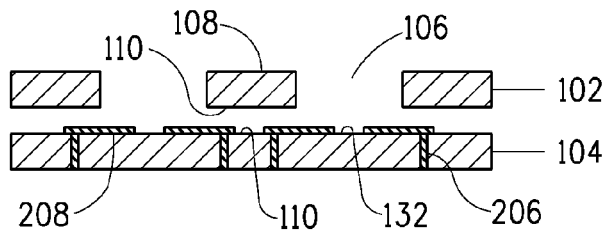

Next, in step (B), as shown in FIG. 4C, electrodes are formed on the first ceramic green sheet and/or second ceramic green sheet. An electrically conductive paste is used to form the electrodes. In FIG. 4C, the example is shown of forming electrodes 208 on the side of the second ceramic green sheet pressed by the mold. As shown in FIG. 4C, for example, formation of the electrodes can be carried out by forming electrodes 208 using an electrically conductive paste and achieving electrical continuity through via holes 206. Electrically conductive paste is also filled into the via holes 206. Although FIG. 4C shows an example of forming both electrodes 208 and through holes 206, only electrodes 208 may be formed as in the first embodiment. In addition, in the present invention, the electrodes can be provided on only the first ceramic green sheet, only the second ceramic green sheet or both.

In the production process of the present invention, the components of the electrically conductive paste, composition thereof, coating method of the electrically conductive paste, film thickness after coating and the like are as described in the first embodiment.

Figure 4D:
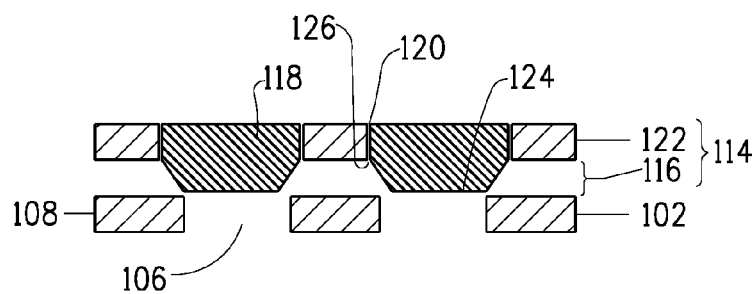

Next, in step (C), as shown in FIG. 4D, a first mold 114 is inserted into the through holes 106 of the first ceramic green sheet 102. As will be explained in a third aspect of the present invention to be described later, this mold comprises an insertion portion 118 having a convex portion 116, and a base portion 122 having an insertion portion housing portion 120 that houses the insertion portion 118, and the convex portion 116 has a tapered shape such that the apex (distal end surface) 124 of the convex portion is smaller than the bottom 126 of the convex portion. In the present embodiment, differing from the first to third embodiments, it is not necessary to form a groove in the apex of the convex portion of the mold. However, a mold similar to that used in the first to third embodiments can be used. The mold 114 has a structure and composition, including materials, as explained in the first embodiment with the exception of not forming a groove in the apex of the convex portion.

This mold 114 is layered such that the convex portion 116 of the mold is inserted into the through holes 106 of the ceramic green sheet substrate.

Figure 4E:
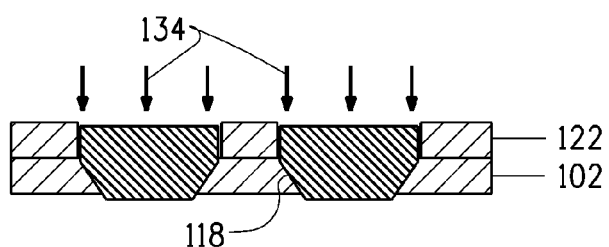
Figure 4F:
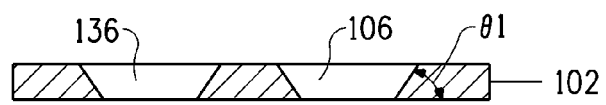

Next, as shown in FIG. 4E, the first ceramic green sheet and the mold are pressed. As a result of this pressing, an incline is provided in the walls of the through holes 106 of the first ceramic green sheet 102 (FIG. 4F).

Although the pressing conditions are adjusted according to the type of first ceramic green sheet, the temperature range is preferably 50 to 110° C., and the pressure 134 is preferably set to 5 to 50 MPa.

In the present invention, as previously described, since the lateral surface of the convex portion 116 of the insertion portion 118 of the mold have an inclined (tapered) shape, and the ceramic green sheet has a certain degree of plasticity, as a result of pressing the convex portion 116 of the mold into the through holes 106 possessed by the first ceramic green sheet and applying pressure, the inner peripheral surfaces of the through holes 106 remember the shape of the inclined (tapered) lateral surface of the convex portion possessed by the mold. In this manner, in the first ceramic green sheet obtained in step (C), although the inner peripheral surfaces (walls) 130 of the through holes 106 thereof are perpendicular to the first surface 108 of the first ceramic green sheet in the case of having formed the through holes with a punch, for example, after being pressed with the mold, an incline of a predetermined angle is formed in the lateral surface 130 of the concave portion. This angle of inclination θ1 (see FIG. 4F) is preferably 10 to 89 degrees. Since the ceramic sheets have thermoplasticity, they soften and match the shape of the mold when heated during pressing. The rigidity of the ceramic sheets returns when they are allowed to cool to the vicinity of room temperature following pressing, thereby enabling them to maintain their formed shape. Furthermore, although the above explanation is of the case of the lateral surface of convex portion 116 of the mold being inclined, the present invention is not limited thereto, but rather the lateral surface of the convex portion may also not be inclined. In addition, the inclined portion of the mold may have a linear or curved direction of inclination. Radiation status can be controlled by adjusting the reflection angle of the light emitted from the LED.

Next, in step (D), a second mold is pressed onto one side of the previously prepared second ceramic green sheet. As a result, a predetermined structure such as a partition is imparted to one side of the second ceramic green sheet (FIGS. 4G to 4K).

Figure 4G:
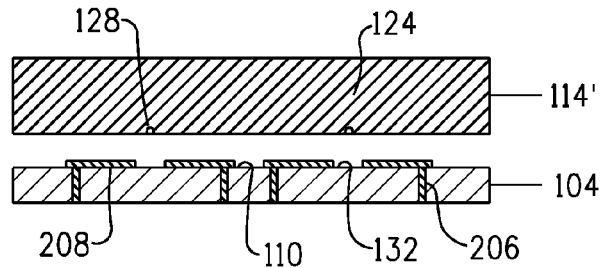

As shown in FIG. 4G, the mold 114' used in this step has a plurality of groove 128 on one side. A conventional mold in the form of the mold 114' can be used for the pressing of this step. A metal material, wood, heat-resistant resin or the like that does not become deformed during press forming can be used for the material of the mold.

Figure 4H:
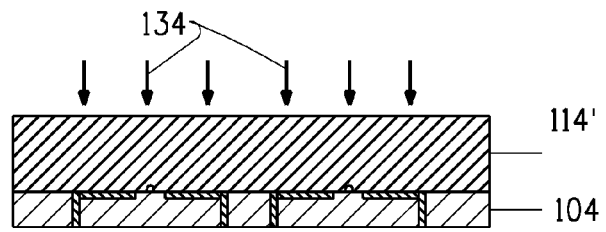
Figure 4I:
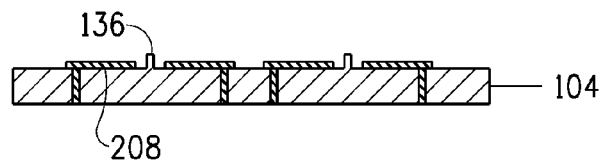

This mold 114' is layered such that the side of the mold that has a plurality of groove 128 contacts one side of the second ceramic green sheet followed by pressing (FIG. 4H). The pressing conditions consist of a pressure of 5 to 50 MPa. A partition 136 is formed on the side of the second ceramic green sheet pressed by the mold 114' as a result of the pressing of this step (FIG. 4I).

Figure 4J:
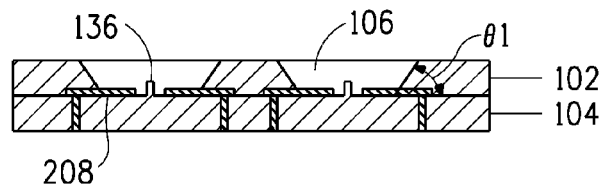
Figure 4K:
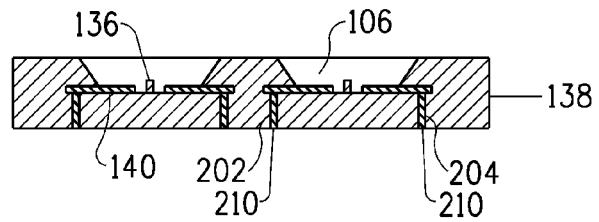

Next, in step (E) and (F), the first ceramic green sheet and the second ceramic green sheet are superimposed and bonded (FIG. 4J). An adhesive such as solvent or resin medium may be preferably used between the first and the second ceramic green sheet to bond them. Or, crimping such as hydrostatic pressure, hydraulic press or just plane press may be preferably used. In the case of hydrostatic pressure, hydraulic press, the ceramic green sheet are preferably slipped in between two board before being put in the bag so that the formed partition would not be crashed by vacuuming. During this superimposition, the partition of the second ceramic green sheet are made to be surrounded by the inner walls of the through holes 106 of the first ceramic green sheet.

Next, in step (G), the ceramic green sheet substrate obtained in step (F) is fired. The firing method and conditions are as explained in the first embodiment.

(II) Ceramic LED Package

A second aspect of the present invention is a ceramic LED package.

The ceramic LED package of the present invention is a surface-mounting ceramic LED package having a ceramic substrate having a concave portion, LED connection electrodes and a partition provided in the bottom of the concave portion for separating the concave portion into two or more areas.

In the present invention, one or a plurality of partitions can be provided in the bottom of the concave portion. The partition may extend in a straight line from one point on the bottom of the concave portion toward another point, or may extend radially from a single point on the bottom of the concave portion, thereby separating the bottom of the concave portion into two or more areas. In addition, the thickness of the partition preferably increases from the opening of the concave portion toward a site in contact with the bottom of the concave portion.

In the present invention, the inner peripheral surface of the concave portion of the ceramic substrate and the surface of the partition preferably has surface irregularities.

Although the following provides an explanation of preferred embodiments of the ceramic LED package of the present invention with reference to FIGS. 5 to 12, these are merely exemplary, and the present invention is not limited thereto.

An example of a ceramic LED package of a first embodiment is explained using FIGS. 5 to 8. FIG. 5A is an overhead view of a ceramic LED package 300, while FIG. 5B is a cross-sectional view taken along line III-III' of FIG. 5A. In addition, FIG. 5C is a drawing showing a ceramic LED package (ceramic LED device) mounted with LED chips. FIGS. 6 to 8 are drawings showing examples of the shape of electrodes of the ceramic LED package of the first embodiment. Furthermore, the description of the electrodes is omitted in FIG. 5.

In this embodiment, the ceramic LED package 300 has a ceramic substrate 138, a concave portion 304 formed roughly in the center thereof, and a partition 308 provided in the bottom 306 of the concave portion 304. A lateral surface 310 of the concave portion 304 has an incline that spreads toward the opening of the concave portion from the bottom 306 thereof. As a result of having this incline, the efficiency of radiation of light from the LED devices is improved. This angle of inclination θ1 (see FIG. 5B) is preferably 10 to 89 degrees. In addition, the inclined wall may have a curved direction of inclination instead of a linear direction of inclination. Since the ceramic LED package of the present invention uses ceramic for the substrate, it is resistant to deterioration by ultraviolet light while also having superior heat dissipation characteristics.

The partition 308 provided in the bottom of the concave portion prevents light radiated from each LED chip from mutually interfering in an LED device installed with a plurality of colored LED chips. There are no particular limitations on the shape of the partition provided it is able to separate the concave portion into a plurality of areas. For example, FIG. 5 shows an example of a rectangular partition (referred to as a I or I-shaped partition in the present specification) extending in a straight line from a point 316 on the bottom of the concave portion toward another point 318.

In the present invention, as will be explained in the second and third embodiments, the partition can have a shape such that it extends, for example, radially from one point on the bottom of the concave portion toward a plurality of other points. Although two LED chips are preferably mounted in the case of the I-shaped partition of the first embodiment (see FIG. 5C), an additional number of LED chips can be mounted as necessary. As shown in FIG. 5C, as a result of providing the partition 308 between an LED chip (e.g., blue LED chip) 312 and an LED chip (e.g., red LED chip) 314, the blue and red light respectively radiated from each chip is guided to the side of the opening without mutually interfering.

Figure 5A:
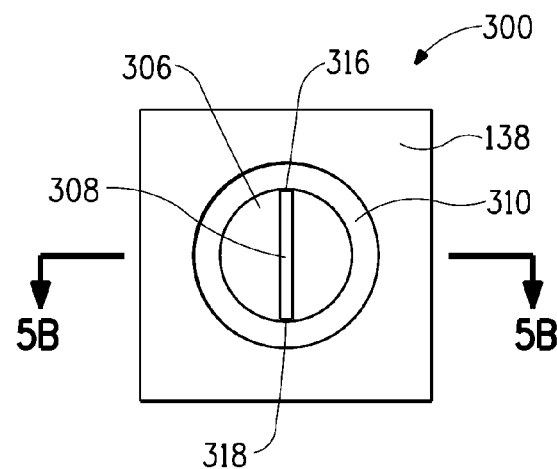
FIG. 5 shows different views of a LED package and device.
Figure 5B:
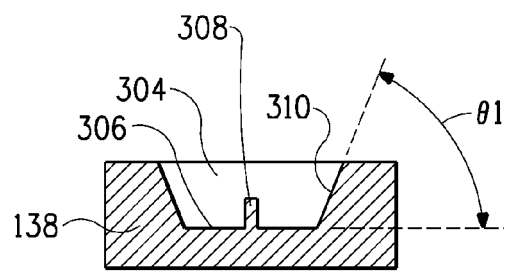
Figure 5C:
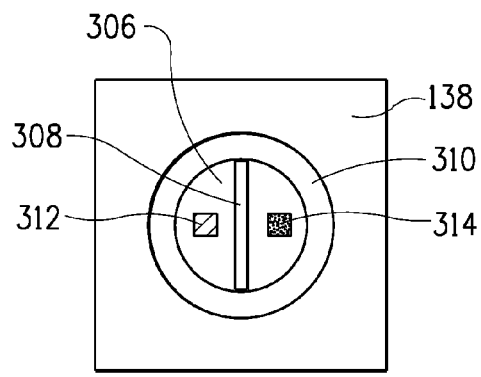

In the specification of the present application, a ceramic LED package refers to that not mounted with an LED chip as shown in FIGS. 5A and 5B, while a ceramic LED device refers to that mounted with LED chips as shown in FIG. 5C.

Figure 6A:
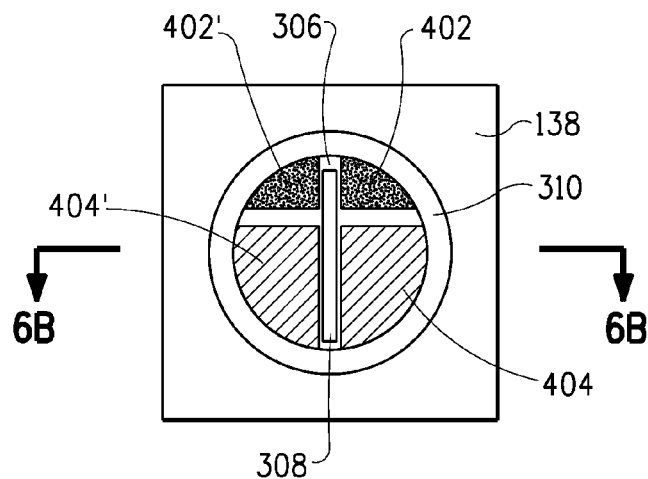
FIG. 6 are various views of a ceramic LED package.
Figure 6B:
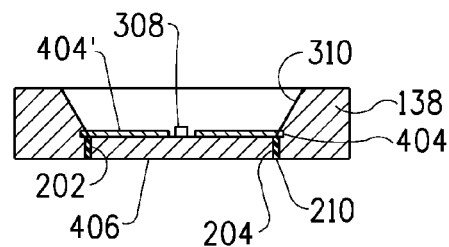
Figure 6C:
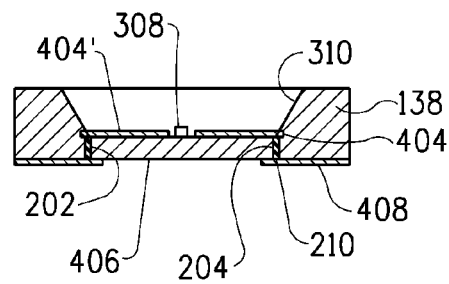

Next, an explanation is provided of the electrodes of the ceramic LED package of the present invention with reference to FIGS. 6 to 8. FIG. 6A is an overhead view, while FIGS. 6B and 6C are cross-sectional views taken along line IV-IV' of FIG. 6A. Furthermore, FIG. 6C shows an example of the case of having provided electrodes when acquiring an electrical connection with the outside on the bottom of a ceramic substrate.

The ceramic LED package of the first embodiment of the present invention has an I-shaped partition. In this embodiment, as shown in FIGS. 6A and 6B, electrodes consisting of cathodes 402 and 402' and anodes 404 and 404' are respectively provided in two areas separated by the partition 308. In FIG. 6, although the electrodes are formed so as to occupy nearly the entirety of each area, the present invention is not limited thereto, but rather the electrodes are only required to at least be formed at those portions where electrical continuity is able to be achieved with the LED chips. In FIGS. 6B and 6C, although an example is shown in which electrical continuity is acquired with the outside by forming via holes 202 and 204 containing conductors in the ceramic substrate, in the present invention, electrical continuity may also be acquired with the outside by wiring the electrodes within the ceramic substrate instead of forming via holes. In addition, electrodes 408 may also be provided on the bottom 406 of the ceramic substrate.

Figure 7A:
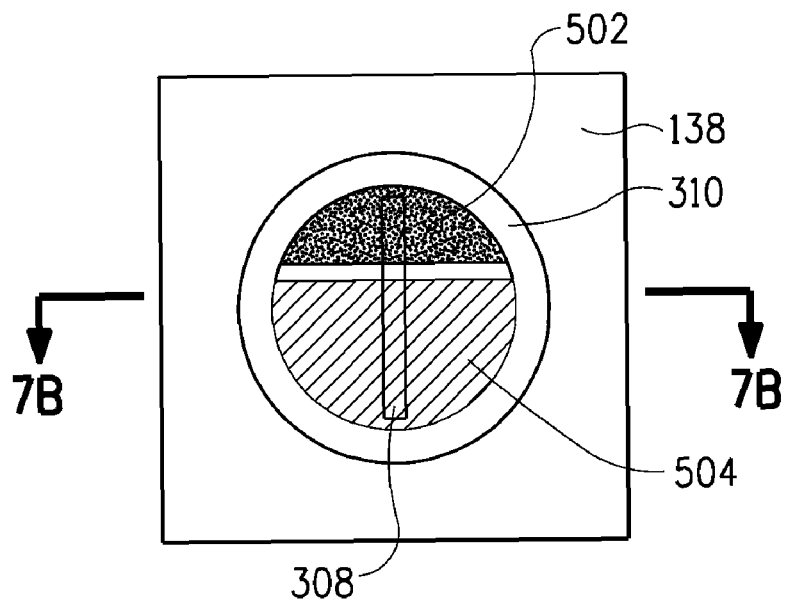
FIG. 7 shows various views of an additional electrode arrangement.
Figure 7B:
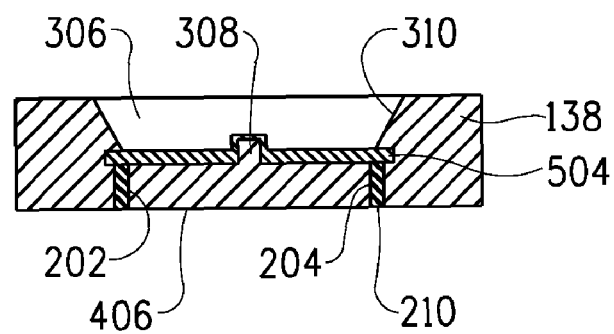

Next, an explanation is provided of another electrode arrangement pattern with reference to FIG. 7. FIG. 7A is an overhead view, while FIG. 7B is a cross-sectional view taken along line V-V of FIG. 7A. As shown in FIG. 7, via holes 202 and 204 containing conductors are provided in ceramic substrate 138, and a cathode 502 and an anode 504 are provided so as to be connected with the conductors of the via holes. In this example, the electrodes are wired so as cover the partition and extend across a plurality of areas. Furthermore, as was also explained in the previously described production process of the present invention, although the electrodes are printed followed by forming the partition by pressing with a mold in the present invention, at this time the electrodes are formed so as to cover the partition as shown in FIG. 7B after sintering, for example, without being severed by the groove of the mold.

Figure 8A:
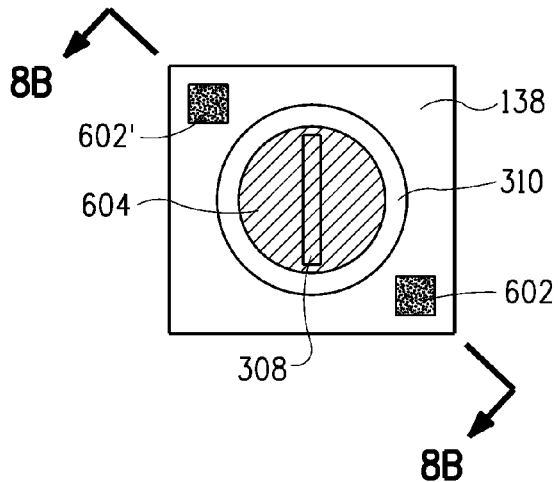
FIG. 8 shows views of another arrangement.
Figure 8B:
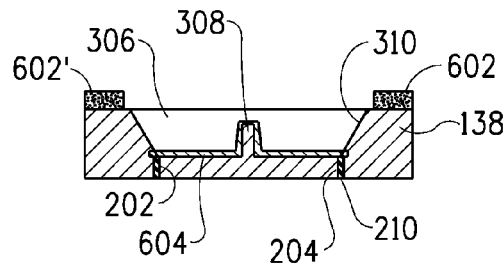
Figure 8C:
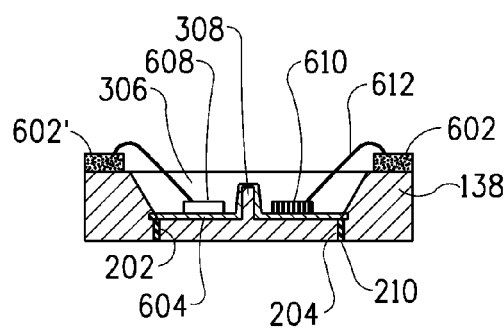

Next, an explanation is provided of still another electrode arrangement pattern with reference to FIG. 8. FIG. 8A is an overhead view, while FIG. 8B is a cross-sectional view taken along line VI-VI' of FIG. 8A. FIG. 8C is a cross-sectional view of an example in which LED chips 608 and 610 are mounted on the package of FIG. 8A.

As shown in FIG. 8, via holes 202 and 204 containing conductors are provided in the ceramic substrate 138, and an anode 604 is provided so as to be connected with the conductors of the via holes. In addition, cathodes 602 and 602' are provided on the side of the opening of concave portion 306 of the ceramic substrate. In this example, the LED chip and cathodes 602 and 602' are connected by wires 612. The anode 604 of this example is arranged over the entire surface so as to extend across a plurality of areas while covering the partition. Furthermore, in this example as well, the anode 604 is formed so as to cover the partition as shown in FIG. 8B after sintering, for example, without being severed.

Second Embodiment

Figure 9A:
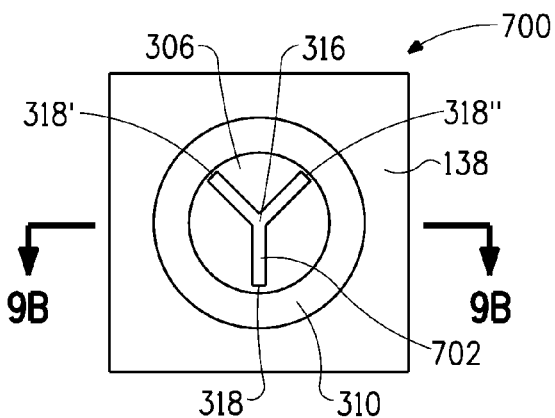
FIG. 9 shows overhead and other views of an LED package.
Figure 9B:
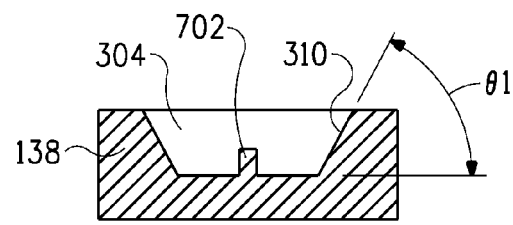
Figure 9C:
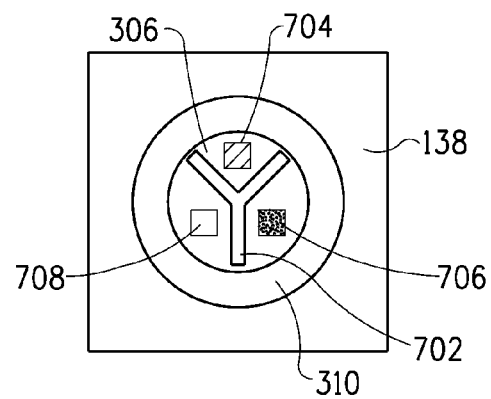
Figure 10A:
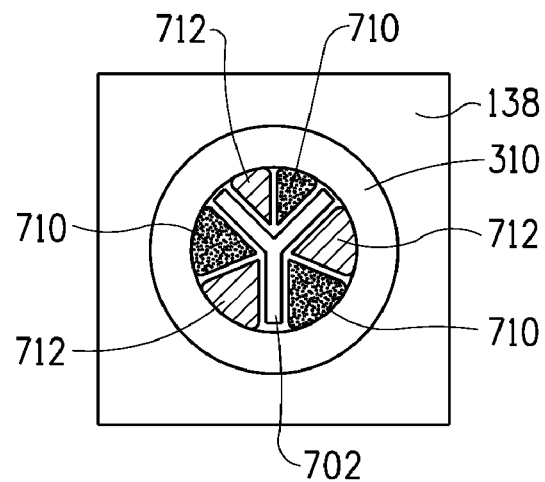
FIGS. 10A and 10B show examples of the shapes of electrodes.
Figure 10B:
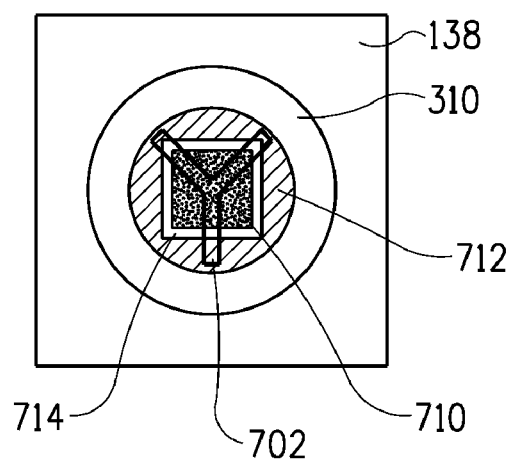

The following provides an explanation of an example of a second embodiment of the ceramic LED package according to FIGS. 9 and 10. FIG. 9A is an overhead view of a ceramic LED package 700, while FIG. 9B is a cross-sectional view taken along line VII-VII' of FIG. 9A. In addition, FIG. 9C shows a ceramic LED package mounted with LED chips (ceramic LED device). FIGS. 10A and 10B are drawings showing examples of the shapes of the electrodes of the ceramic LED package of the second embodiment. Furthermore, a description of the electrodes is omitted in FIG. 9.

In this embodiment, the ceramic LED package 700 has a ceramic substrate 138, a concave portion 304 formed in roughly the center thereof, and a partition 702 provided in the bottom 306 of the concave portion. The shape of the lateral surface 310 of the concave portion 304, the inclination angle (θ1) and other characteristics are the same as in the first embodiment.

There are no particular limitations on the shape of the partition 702 provided in the bottom of the concave portion provided it is able to separate the concave portion into a plurality of areas. For example, FIG. 9 shows an example of providing a Y (or Y-shaped) partition in the center of the bottom of the concave portion.

In the specification of the present application, the state of the partition extending in the form of a plurality of straight or curved lines from a specific point on the bottom of the concave portion toward the lateral surface of the concave portion is defined as "extending radially". For example, in the example shown in FIG. 9A, the partition 702 extends linearly and radially from a point 316 on the bottom of the concave portion toward the lateral surface 310 of the concave portion, namely toward a plurality of other points (in this case, 3 points) 318, 318' and 318".

The partition prevents light radiated from each LED chip from mutually interfering in an LED device installed with a plurality of colored LED chips in the same manner as in the first embodiment.

In the case of the Y-shaped partition of the second embodiment, although three LED chips are preferably mounted (see FIG. 9C), an additional number of LED chips can be mounted as necessary. As shown in FIG. 9C, as a result of providing the partition 702 between an LED chip (e.g., blue LED chip) 704, an LED chip (e.g., red LED chip) 706 and an LED chip (e.g., green LED chip) 708, decreases in brightness of the blue, red and green light respectively radiated from each chip are inhibited without mutually interfering.

Next, an explanation is provided of the electrodes of the ceramic LED package of the present invention with reference to FIG. 10. FIG. 10A shows the case of respectively providing electrodes in areas separated by a partition, while FIG. 10B shows the case of forming electrodes over the entire concave portion irrespective of the partition.

The ceramic LED package of the second embodiment of the present invention has a Y-shaped partition. In this embodiment, as shown in FIG. 10A, the electrodes are respectively provided in the form of cathodes 710 and anodes 712 in three areas separated by a partition 702. In the present embodiment as well, each electrode is not required to be formed over the entirety of each area separated by the partition, but is only required to at least be formed in those areas where electrical continuity is able to achieved with the LED chips.

Next, an explanation is provided of another electrode arrangement pattern (case of forming the electrodes over the entire concave portion irrespective of the partition) with reference to FIG. 10B. As shown in FIG. 10B, cathode 710 and anode 712 are provided with an insulating portion 714 therebetween in the central area of the concave portion of ceramic substrate 138 and on the side of the lateral surface 310 of the concave portion of the area thereof, respectively. In this example as well, the electrodes are arranged covering the partition so as to extend across a plurality of areas. Furthermore, as was also explained in the previously described production process of the present invention, although the electrodes are printed followed by forming the partition by pressing with a mold in the present embodiment as well, at this time the electrodes are formed so as to cover the partition without being severed by the groove of the mold.

Third Embodiment

Figure 11A:
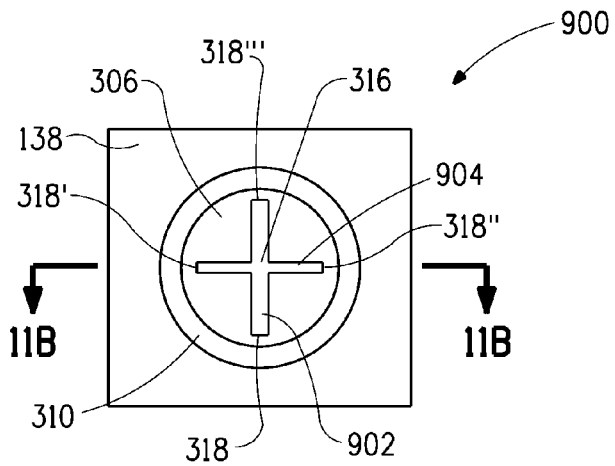
FIG. 11 shows an embodiment with shaped partitions.
Figure 11B:
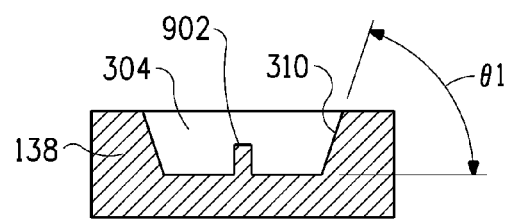
Figure 11C:
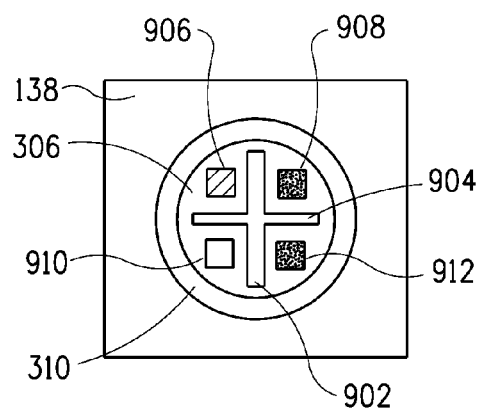
Figure 12A:
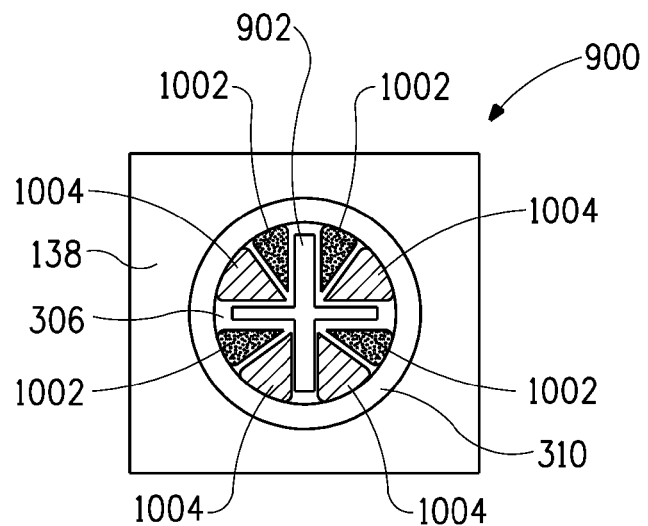
FIG. 12 shows the case of providing electrodes in areas separated by partitions.
Figure 12B:
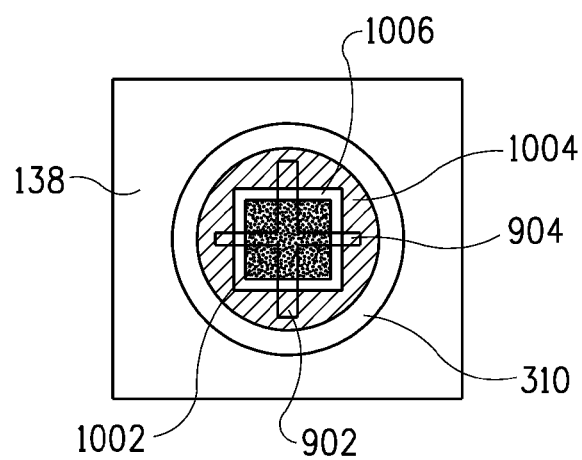

The following provides an explanation of an example of a ceramic LED package of a third embodiment according to FIGS. 11 and 12. FIG. 11A is an overhead view of a ceramic LED package 900, while FIG. 11B is a cross-sectional view taken along line IX-IX' of FIG. 11A. In addition, FIG. 11C shows a ceramic LED package mounted with LED chips (ceramic LED device). FIGS. 12A and 12B are drawings showing examples of the shapes of electrodes of the ceramic LED package of the third embodiment. Furthermore, a description of the electrodes is omitted in FIG. 11.

In this embodiment, the ceramic LED package 900 has a ceramic substrate 138, a concave portion 304 formed in roughly the center thereof, and partitions 902 and 904 provided in the bottom 306 of the concave portion. The shape of the lateral surface 310 of the concave portion 304, the inclination angle (θ1) and other characteristics are the same as in the first embodiment.

There are no particular limitations on the shape of the partitions 902 and 904 provided in the bottom of the concave portion provided they are able to separate the concave portion into a plurality of areas. For example, FIG. 11 shows an example of providing + (plus) (or +-shaped) partitions in the center of the bottom of the concave portion. As shown in FIG. 11A, partitions 902 and 904 extend radially toward the lateral surface 310 of the concave portion from a single point 316 on the bottom of the concave portion, namely toward a plurality of other points (in this case, 4 other points) 318, 318', 318" and 318'''.

The partitions prevent light radiated from each LED chip from mutually interfering in an LED device installed with a plurality of colored LED chips in the same manner as in the first and second embodiments.

In the case of the +-shaped partitions of the third embodiment, although four LED chips are preferably mounted (see FIG. 11C), an additional number of LED chips can be mounted as necessary. As shown in FIG. 11C, as a result of providing the partitions 902 and 904 between an LED chip (e.g., blue LED chip) 906, an LED chip (e.g., green LED chip) 908, an LED chip (e.g., red LED chip) 910 and an LED chip (e.g., green LED chip) 912, decreases in brightness of the blue, green and red light respectively radiated from each chip are inhibited without mutually interfering.

Next, an explanation is provided of the electrodes of the ceramic LED package of the present invention with reference to FIG. 12. FIG. 12A shows the case of respectively providing electrodes in areas separated by partitions, while FIG. 12B shows the case of forming electrodes over the entire concave portion irrespective of the partitions.

The ceramic LED package of the third embodiment of the present invention has +-shaped partitions. In this embodiment, as shown in FIG. 12A, the electrodes are respectively provided in the form of cathodes 1002 and anodes 1004 in four areas separated by the partitions 902 and 904.

Next, an explanation is provided of another electrode arrangement pattern (case of forming the electrodes over the entire concave portion irrespective of the partitions) with reference to FIG. 12B. As shown in FIG. 12B, cathodes 1002 and anodes 1004 are each provided with an insulating portion 1006 therebetween in the central area of the concave portion of ceramic substrate 138 and on the side of the lateral surface 310 of the concave portion of the area thereof. In this example as well, the electrodes are arranged covering the partitions so as to extend across a plurality of areas. Furthermore, as was also explained in the previously described production process of the present invention, although the electrodes are printed followed by forming the partitions by pressing with a mold in the present embodiment as well, at this time the electrodes are formed so as to cover the partitions without being severed by the groove of the mold.

Although the preceding explanations have provided explanations of specific embodiments of the ceramic LED package of the present invention, the present invention is not limited thereto, but rather, for example, the partition is not required to be I-shaped, Y-shaped or +-shaped as described above, but instead can separate the bottom of the concave portion into a plurality of areas by forming partition extending in a straight line or curved line from a single point on the bottom of the concave portion toward a plurality of other points. Furthermore, although the cases in the examples described above depict the partitions having a slight gap of about, for example, 0.5 mm from the lateral surface of the concave portion without being formed so as to contact the lateral surface of the concave portion, the present invention is not limited thereto, but rather the partitions can also be formed so as to contact the lateral surface of the concave portion so as to divide the concave portion into two or more areas. The length of the partitions is longer than the LED chips. In addition, in the case of mounting LED chips, the LED package of the present invention is applicable not only to the case of simultaneously illuminating all LED chips, but also to the case of illuminating each LED chip separately. The shape of the electrodes is not limited to each of the embodiments described above, but rather can have a shape applicable to simultaneously illuminating all LEDs or illuminating each LED chip separately.

(III) Mold

A third aspect of the present invention is a mold for producing the ceramic LED package of the present invention. The mold of the present invention comprises an insertion portion having a convex portion and a base portion having an insertion portion housing portion that houses the insertion portion, has a shape (tapered shape) in which the apex of the convex portion is smaller than the bottom of the convex portion, and the distal end surface of the convex portion has a groove. The sidewalls of the groove are able to be inclined so that the opening of the groove is wider than the bottom. A gap is provided between the insertion portion and the base portion. As a result of composing in this manner, the convex portion is able to slide perpendicular to the base portion. The lateral surface of the convex portion and/or the groove may have fine surface irregularities in the surface thereof. In addition, the material of the mold is a metal material, wood or heat-resistant resin that does not significantly deform during pressing.

In another embodiment, the mold of the present invention does not have a groove in the apex of the convex portion. In still another embodiment, the convex portion of the mold of the present invention does not have a tapered shape while the distal end surface of the convex portion has a groove.

Figure 13A:
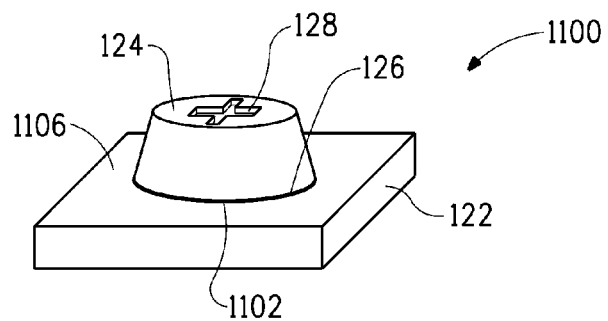
FIG. 13 is a perspective view of the mold of the present invention.
Figure 13B:
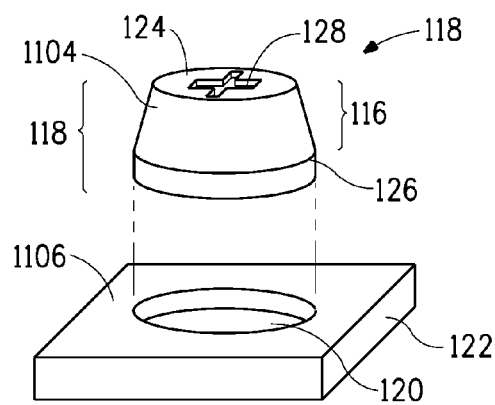
Figure 13C:
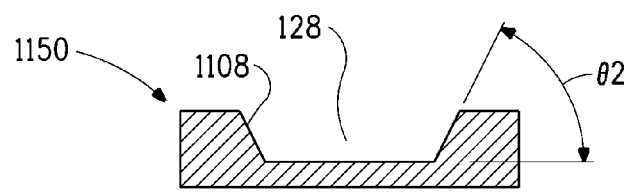
Figure 14A:
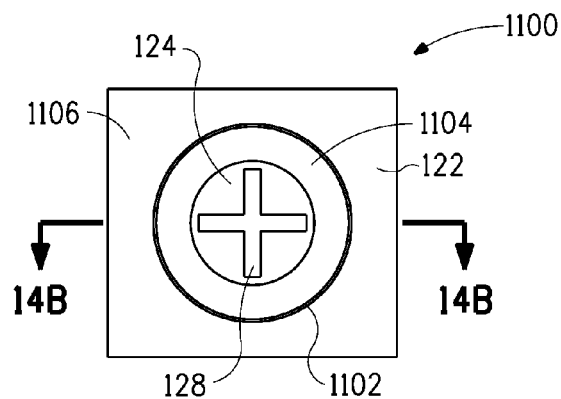
FIGS. 14A-C are various views of the invention.
Figure 14B:
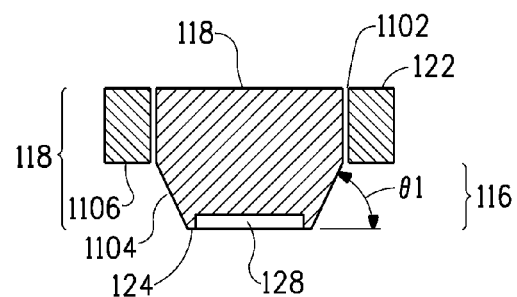
Figure 14C:
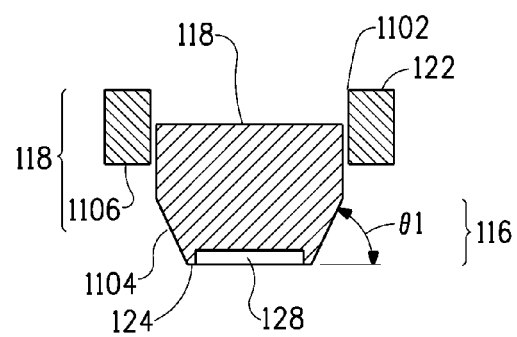

Although the following provides an explanation of the mold of the present invention with reference to FIGS. 13 and 14, these are merely exemplary of the present invention, and the present invention is not limited thereto. FIG. 13A is a perspective view of the mold of the present invention, FIG. 13B is an exploded perspective view of FIG. 13A, and FIG. 13C is a partially enlarged view of a groove 128. In addition, FIG. 14A is an overhead view of the mold of FIG. 13A, FIG. 14B is a cross-sectional view taken along line XII-XII' of FIG. 14A, and FIG. 14C shows a state in which an insertion portion has slid in FIG. 14B.

As shown in FIGS. 13A to 13C and FIGS. 14A to 14C, a mold 1100 comprises an insertion portion 118 having a convex portion 116, and a base portion 122 having an insertion portion housing portion 120 that houses the insertion portion 118. The convex portion 116 has the shape of a circular truncated cone in which the apex (distal end surface) 124 of the convex portion is smaller than a bottom 126 of the convex portion (namely, the cross-section thereof has a tapered shape). In addition, the mold has a groove 128 on the distal end surface 124 of the convex portion.

In addition, portions other than groove 128 of the distal end surface 124 of the convex portion are in a plane parallel with the surface 1106 on the side having the convex portion of base portion 122 (also referred to as the base portion front surface).

In a preferred embodiment of the present invention, lateral surface 1104 of the convex portion of the mold may be surface irregularities instead of being smooth. As a result of these protrusions, the inner peripheral surface of the concave portion of the ceramic substrate also has surface irregularities instead of being smooth. These surface irregularities have the effect of scattering light radiated from an LED chip, enabling light to uniformly travel across the entire area separated by the partition.

The mold of the present invention has a groove 128 on the distal end surface of the convex portion. As a result of having this groove, the green sheet on the bottom of the concave portion of the green sheet enters the groove to form a partition when the convex portion is pressed into the concave portion of the green sheet. The shape of this groove is preferably a groove in the shape of a straight line or curved line extending from a single point on the distal end surface 124 of the convex portion toward another point on the distal end surface, or a groove in the shape of a straight line or curved line extending from a single point on the distal end surface 124 of the convex portion toward a plurality of other points on the distal end surface. For example, an example of a first shape of the groove is an I-shaped groove, while an example of a second shape of the groove is a Y-shaped groove. An example of a third shape of the groove is a +-shaped groove (see FIGS. 13 and 14). In the present invention, the shape of the groove is not limited to the first to third shapes above, but rather can have various shapes.

As shown in FIG. 13C, a wall 1108 of the groove may preferably be inclined so that the width of the groove increases toward the direction of the opening of the groove in order to incline the wall of the partition. The angle of inclination θ2 formed with the lateral surface 1108 of this groove (see FIG. 13C) is preferably 50 to 70 degrees. The wall of the partition is also inclined corresponding to the incline of the lateral surface 1108 of this groove. This incline of the partition wall has the effect of reflecting light radiated from an LED chip and guiding it to the opening. In addition, surface irregularities may be formed in at least the lateral surface 1108 of the groove 128. As a result of composing in this manner, surface irregularities can be formed in the partition during the pressing of step (v) of the previously described production process of the present invention (first embodiment).

In a fourth embodiment of the production process of the present invention, in the case of a mold that presses a first ceramic sheet, it is not necessary to provide the groove 128 in the apex of the convex portion as shown in mold 114 of FIG. 4D.

The mold is provided with a gap 1102 between the base portion 122 and the insertion portion 118, and the insertion portion 118 is able to slide in a direction perpendicular to the base portion 122 (see FIG. 14C). This gap 1102 is preferably 1 to 100 μm, and more preferably 10 to 50 μm. This is so that the insertion portion 118 does not slide from the base portion 122 under normal conditions, but is able to slide when considerable pressure is applied to the back of the insertion portion 118. In addition, if this gap is excessively large, the green sheet ends up being pushed into the gap, thereby preventing the obtaining of the desired shape of the ceramic substrate, while if the gap is excessively small, an excessively large amount of pressure is required to cause the insertion portion to slide. The use of the mold of the present invention enables the insertion portion 118 to be pressed independently of the base portion 122, resulting in each concave portion being pressed uniformly. Thus, during the pressing of step (v) of the production process of the present invention, the bottom 306 of the concave portion becomes flat after pressing despite any protrusions on the surface of the green sheet. In this manner, in order to adequately press convex portion 116 of the mold into a concave portion of the green sheet substrate, it is effective for the convex portion 116 to slide in the direction in which pressure is applied independently of the base portion 122 by virtue of gap 1102 when pressure has been applied from the back of the mold.

Moreover, if a mold is used that allows insertion portion 118 to slide independently of base portion 122, in the case a groove 128 is present in the distal end surface 124 of a convex portion, a portion of the green sheet is reliably filled into that groove, thereby enabling a partition to be formed reliably.

Although FIGS. 13 and 14 show the example of the convex portion of the mold having the shape of a circular truncated cone (namely, the shape of the distal end surface 124 is circular), the present invention is not limited thereto. The shape of the convex portion may be a shape that allows the obtaining of a desired concave portion 304 of a ceramic LED package. For example, when viewed from the distal end surface 124 of the convex portion, the shape of the distal end surface 124 may be oval, rectangular and so forth.

In the mold of the present invention, the lateral surface 1104 of the convex portion preferably is inclined at a predetermined angle (θ1). In the present invention, the angle (θ1) formed by lateral surface 1104 of the convex portion and a plane extending along a straight line from the distal end surface 124 of the convex portion (portion indicated with broken lines in FIG. 14B) is preferably 10 to 89 degrees. Furthermore, even in the case of having a distal end surface of various shapes other than a circular shape as described above, the lateral surface is still preferably inclined at the above-mentioned angle (θ1).

In addition, the mold of the present invention may have a plurality of insertion portions in a single base portion. A composition comprising a base portion and a plurality of insertion portions is as previously described. In particular, each insertion portion is able to slide perpendicularly to the base portion due to a gap present between each insertion portion and an insertion portion housing portion. Thus, the problem of all concave portions not being pressed uniformly, due to variations in the pressure applied to the back of the mold or slight variations in the shape of the concave portion of the ceramic green sheet substrate, can be overcome. If all concave portions are not pressed uniformly, problems such as the back rising up in some of the concave portions or a partition not being formed in other concave portions may occur, thus having an effect on yield.

When pressing the mold into a green sheet, the distal end surface of an insertion portion of the mold adheres to the surface of a green sheet, air enters the groove in the distal end surface of the insertion portion of the mold and ends up being trapped therein. However, this air is pressurized and contracted by the pressing of the mold. Thus, entry of the green sheet into the groove to form a partition is not impaired. However, since a void is formed between the back of the groove and the surface of the green sheet corresponding to the air compressed at this time, the shape of the partition does not match the shape of the groove, but rather has a shape that differs somewhat from the shape of the groove. Accordingly, it is preferable to set the groove of the mold and the conditions for pressing the mold so that a partition height is obtained that enables it to demonstrate the function of blocking light radiated from an LED chip.

On the other hand, in the case of applying a hydrostatic press, the above-mentioned problem of air being trapped in the groove of the mold is overcome since the mold and green sheet are placed in a water-impermeable bag prior to pressing and drawing a vacuum within the bag.

In the fourth embodiment of the production process of the present invention, a mold 114' as shown in FIG. 4G or FIG. 4H is used in the case of a mold that presses a second ceramic green sheet (second mold). This mold 114' is a flat board and has a plurality of groove on one side, and the groove is provided for forming a partition on one side of the second ceramic green sheet. The groove 128 is as previously described.

Next, an explanation is provided of a production process of the mold of the present invention using FIG. 15. FIGS. 15A and 15A' are a perspective view and overhead view of a substrate serving as a base portion, FIGS. 15B and 15B' are a perspective view and overhead view of a substrate in which an insertion portion housing portion has been formed in the substrate, FIG. 15C is an overhead view depicting an insertion portion, and FIG. 15D is an exploded view depicting the insertion portion and the base portion.

Figure 15A:
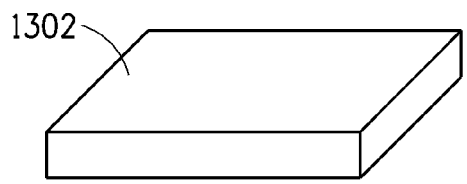
FIGS. 15A-15D are viewed of the substrate from different angles showing the insertion portions for the LED package.
Figure 15B:
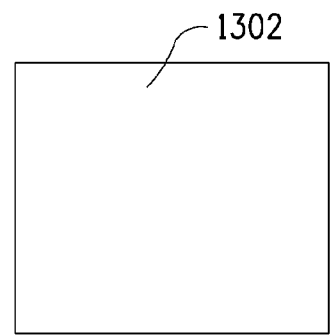
Figure 15C:
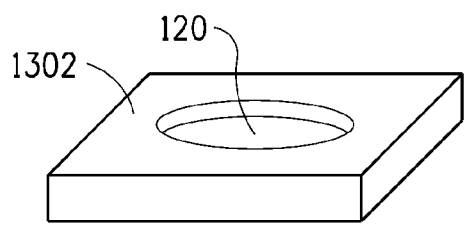
Figure 15D:
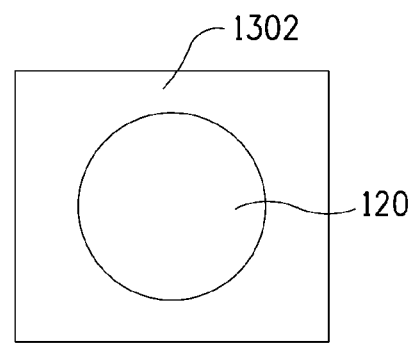
Figure 15E:
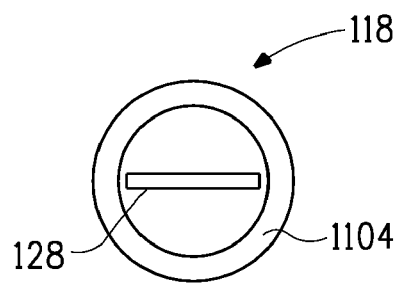
Figure 15F:
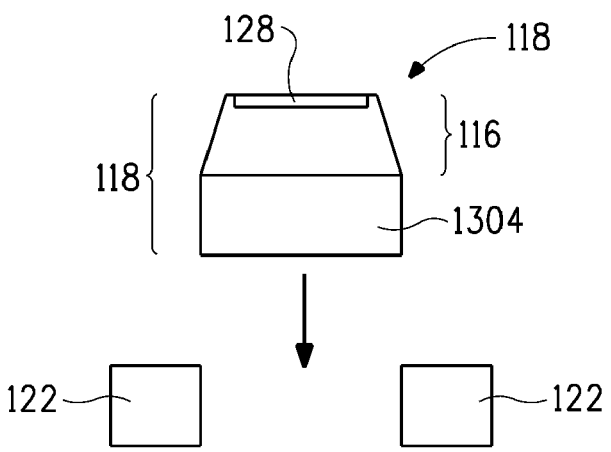

As shown in FIGS. 15A and 15A', the base portion 122 is fabricated by providing the insertion portion housing portion 120 in one substrate 1302 (thickness: 3-5 mm) by an ordinary means such as punching (see FIGS. 15B and 15B'). Next, the insertion portion 118 is fabricated in accordance with standard methods for fabricating a mold such that the insertion portion 118 has a maximum diameter that is about 20 μm smaller than the diameter of the insertion portion housing portion 120 (see FIG. 15C). The resulting insertion portion is then inserted into the insertion portion housing portion of the base portion. When press-forming a ceramic green sheet having a plurality of concave portions all at once, the mold is also provided with a plurality of insertion portions 118 corresponding to the number of concave portions. Accordingly, a plurality of insertion portion housing portions may be provided in an iron plate and insertion portions may be inserted into the insertion portion housing portions, respectively. A gap of 1 to 200 μm is present between the inner peripheral surface of the insertion portion housing portion of the base portion and the outer peripheral surface 1304 of the portion of the insertion portion housed in the base portion. In the case of a gap having these dimensions, the insertion portion 118 does not slide from the base portion 122 under normal conditions. As a result of applying pressure such as pressure of 1 to 50 MPa, the insertion portion slides perpendicular to the base portion. The material of the mold of the present invention is required to have rigidity that prevents it from being deformed as a result of applying pressure and not deform at least under conditions of a temperature of 10 to 150° C. and pressure of 1 to 50 MPa. More specifically, examples of materials used for the base portion and insertion portion include iron, aluminum, copper, brass, stainless steel and alloys thereof.

EXAMPLES

Ceramic Green Sheet Substrate Lamination Step

Four LTCC ceramic green sheets measuring 75 mm long, 75 mm wide and 0.3 mm thick were used for the ceramic green sheet substrate. Two of the sheets were used for the upper layer of the ceramic green sheet substrate, while the other two sheets were used for the lower layer. The two green sheets for the upper layer of the ceramic green sheet substrate were superimposed, and four round through holes having a diameter of 5.2 mm were formed therein with a punch. Next, two ceramic green sheets not having through holes were superimposed, electrically conductive paste was printed at the required locations corresponding to the locations where LED chips are to be mounted, and allowed to dry. The two ceramic green sheets having through holes were then superimposed on the two ceramic green sheets not having through holes but printed with electrically conductive paste as described above. The through holes of the ceramic green sheets of the upper layer serve as concave portions of the ceramic substrate.

Green sheet properties: sheet density: about 2 g/cm$^3$, tensile strength: about 100 to 140 g/mm$^2$, surface roughness (Ra): <1 μm, minimum bending radius: >2 mm (under 20° C.), 1 to 2 mm (20 to 30° C.), <1 mm (30 to 50° C.)

Post-firing ceramic properties: aluminum oxide/titanium oxide powder content, density: about 2.9 g/cm$^3$, surface roughness (Ra): <1 μm, visible light reflectance rate: >90%, bending strength: about 200 MPa at 0.3 mm thickness.

Press Forming Step

An iron plate having a thickness of 3 mm was placed on the back of the ceramic green sheet substrate, a brass mold was inserted onto the front of the ceramic green sheet substrate, and a ceramic green sheet substrate interposed between the base plate and the mold was placed in a water-impermeable bag (PTS bag, 250 mm long×175 mm wide, Mitsubishi Gas Chemical Co., Inc.). The insertion portion of the mold was in the shape of a circular truncated cone in which the angle θ1 formed between the bottom of the base portion and the lateral surface of the insertion portion was 60 degrees, while the distal end surface of the insertion portion was circular having a diameter of 5.2 mm, the base of the insertion portion was circular having a diameter of 6.0 mm, and the length of the inclined portion was 0.55 mm. +-shaped grooves, composed of two straight lines measuring 5.2 mm in length passing through the center of the distal end surface were provided at a depth of 0.4 mm in the distal end surface of the insertion portion. In addition, a 15 μm gap was present between the insertion portion and the base portion. Next, a vacuum was drawn within the bag with a vacuum packing machine (V-280, Tosei Electric Corp.). The ceramic green sheet substrate and the mold were then pressed with a hydrostatic press (Hot Water Laminator, Nikkiso Co., Ltd.) while still contained in the water-impermeable bag. The pressing conditions at that time consisted 70° C. at 10 MPa for 10 minutes. In addition, the pressed ceramic green sheet substrate and mold were allowed to cool on standing to room temperature following pressing after which the green sheet compact was separated from the mold. Furthermore, prior to pressing, a small amount of release agent in the form of silicone oil and the like was applied to the surface of the mold and base plate to facilitate separation from the green sheet after pressing.

Ceramic Green Sheet Substrate Firing Step

Simultaneous to crimping the green sheets with the hydrostatic press, the lateral surfaces of the concave portions of the ceramic substrate were inclined by the mold and a +-shaped partition was formed in the bottoms of the concave portions. Subsequently, the crimped ceramic green sheet was fired in a box oven at a heating rate of 100° C./hr and holding at a temperature of 870° C. for 1 hour.

As a result of going through the steps described above, a ceramic LED package was formed having a +-shaped partition (having a length and width of about 4.5 mm and height of about 0.35 mm). The drawings are provided to explain the production process.

What is claimed is:

1. A production process of a surface-mounting ceramic LED package, comprising the steps of:
   (A) preparing a first ceramic green sheet and a second ceramic green sheet and forming through holes in the first ceramic green sheet;
   (B) forming LED connection electrodes in the first ceramic green sheet and/or the second ceramic green sheet;
   (C) inserting and pressing a first mold into the through holes of the first ceramic green sheet, the first mold comprising an insertion portion having a convex portion and a base portion having an insertion portion housing portion that houses the insertion portion, the insertion portion having a shape in which the apex of the convex portion is smaller than the bottom of the convex portion, the convex portion protruding from the base portion and being pressed so as to incline the walls of the through holes, and the base portion pressing portions other than the through holes;
   (D) pressing a second mold onto one side of the second ceramic green sheet, the second mold being provided with a groove for forming a partition in one side of the second ceramic green sheet, and a partition being provided in the surface of one side of the second ceramic green sheet by pressing with the mold;

(E) layering the first ceramic green sheet and the second ceramic green sheet so that the partition of the second ceramic green sheet is surrounded by the inner walls of the through holes of the first ceramic green sheet;

(F) bonding the first and the second ceramic green sheets to form a ceramic green sheet substrate having a concave portion; and (G) firing the bonded ceramic green sheet substrate to form a ceramic substrate.

2. The production process of a surface-mounting ceramic LED package according to claim 1, wherein the groove of the second mold extends in a straight line from one point to another point, or a plurality of grooves extend radially from a single point.

3. The production process of a surface-mounting ceramic LED package according to claim 1, wherein the lateral surface of the groove is inclined so as to spread from the bottom of the groove toward the opening to incline the lateral surface of the partition.

4. The production process of a surface-mounting ceramic LED package according to claim 1, wherein the lateral surface of the groove has surface irregularities, thereby the surface of the partition is formed with surface irregularities.

5. The production process of a surface-mounting ceramic LED package according to claim 1, wherein the first mold is provided with a gap between the base portion and the insertion portion, and the insertion portion slides in a direction perpendicular to the base portion.

6. The production process of a surface-mounting ceramic LED package according to claim 1, wherein the pressing step (B) for pressing the first green sheet with the first mold comprises the steps of: placing the ceramic green sheet and the mold in a water-impermeable bag and drawing a vacuum inside the bag; and pressing the bag in which a vacuum has been drawn by hydrostatic pressure or hydraulic pressure.

* * * * *